(12) United States Patent
Sakurai et al.

(10) Patent No.: US 10,879,086 B2
(45) Date of Patent: Dec. 29, 2020

(54) SUBSTRATE CLEANING DEVICE, SUBSTRATE CLEANING APPARATUS, METHOD FOR MANUFACTURING CLEANED SUBSTRATE AND SUBSTRATE PROCESSING APPARATUS

(71) Applicant: EBARA CORPORATION, Tokyo (JP)

(72) Inventors: Takeshi Sakurai, Tokyo (JP); Eiji Hirai, Tokyo (JP); Kaoru Hamaura, Tokyo (JP); Mitsuru Miyazaki, Tokyo (JP); Koji Maruyama, Tokyo (JP)

(73) Assignee: EBARA CORPORATION, Tokyo (JP)

( * ) Notice: Subject to any disclaimer, the term of this patent is extended or adjusted under 35 U.S.C. 154(b) by 178 days.

(21) Appl. No.: 16/019,415

(22) Filed: Jun. 26, 2018

(65) Prior Publication Data

US 2018/0308716 A1    Oct. 25, 2018

Related U.S. Application Data

(62) Division of application No. 14/334,394, filed on Jul. 17, 2014, now Pat. No. 10,032,655.

(51) Int. Cl.
*B08B 1/00* (2006.01)
*H01L 21/67* (2006.01)

(52) U.S. Cl.
CPC .. *H01L 21/67046* (2013.01); *H01L 21/67051* (2013.01); *B08B 1/007* (2013.01)

(58) Field of Classification Search
CPC ......... H01L 21/67046; H01L 21/67051; B08B 1/007

(Continued)

(56) References Cited

U.S. PATENT DOCUMENTS 5,647,083 A     7/1997  Sugimoto et al.
5,693,148 A    12/1997  Simmons et al.
(Continued)

FOREIGN PATENT DOCUMENTS

JP    08-010719 A    1/1996
JP    H08-071511 A   3/1996
(Continued)

OTHER PUBLICATIONS

Japan Patent Application No. 2013-199471; Office Action—Reasons for Refusal; dated Apr. 18, 2017; 8 pages.

(Continued)

*Primary Examiner* — Tinsae B Ayalew
(74) *Attorney, Agent, or Firm* — BakerHostetler

(57) ABSTRACT

A substrate cleaning device 1 includes a substrate holding unit 10 configured to hold a substrate W, a first cleaning unit 11 having a first cleaning member 11a caused to come into contact with a first surface WA of the substrate W held by the substrate holding unit 10 to clean the first surface WA, a second cleaning unit 12 having a second cleaning member 12a caused to come into contact with the first surface WA of the substrate W held by the substrate holding unit 10 to clean the first surface WA, and a controller 50 configured to control the first and second cleaning units 11, 12 so that, when any one of the first cleaning member 11a and the second cleaning member 12a cleans the first surface WA of the substrate W held by the substrate holding unit 10, the other cleaning member is at a position apart from the substrate W held by the substrate holding unit 10.

13 Claims, 16 Drawing Sheets

(58) Field of Classification Search
USPC .......................................................... 134/151
See application file for complete search history.

(56) References Cited

U.S. PATENT DOCUMENTS

| | | | |
|---|---|---|---|
| 6,158,075 A | 12/2000 | Tanaka et al. | |
| 6,616,509 B1 | 9/2003 | Frost et al. | |
| 2002/0007840 A1* | 1/2002 | Atoh | B08B 1/04 134/1.3 |
| 2002/0092544 A1 | 7/2002 | Namba | |
| 2008/0289652 A1 | 11/2008 | Hamada | |

FOREIGN PATENT DOCUMENTS

| | | |
|---|---|---|
| JP | 10-323631 A | 12/1998 |
| JP | 2002-043267 A | 2/2002 |
| JP | 2005-079216 A | 3/2005 |
| JP | 2006-319279 A | 11/2006 |
| JP | 2007-052300 A | 3/2007 |
| JP | 2008-515171 A | 5/2008 |
| JP | 2009-206139 A | 9/2009 |
| JP | 2010-074191 A | 4/2010 |
| JP | 2013-069776 A | 4/2013 |
| WO | WO 2006/035624 A1 | 4/2006 |

OTHER PUBLICATIONS

China Patent Application No. 201410345524.4; Office Action; dated Nov. 27, 2017; 15 pages.
Japan Patent Application No. 2013-150506; Reasons for Refusal; dated Sep. 27, 2017; 5 pages.
Japan Patent Application No. 2013-150506; Reasons for Refusal; dated Mar. 29, 2017; 6 pages.

* cited by examiner

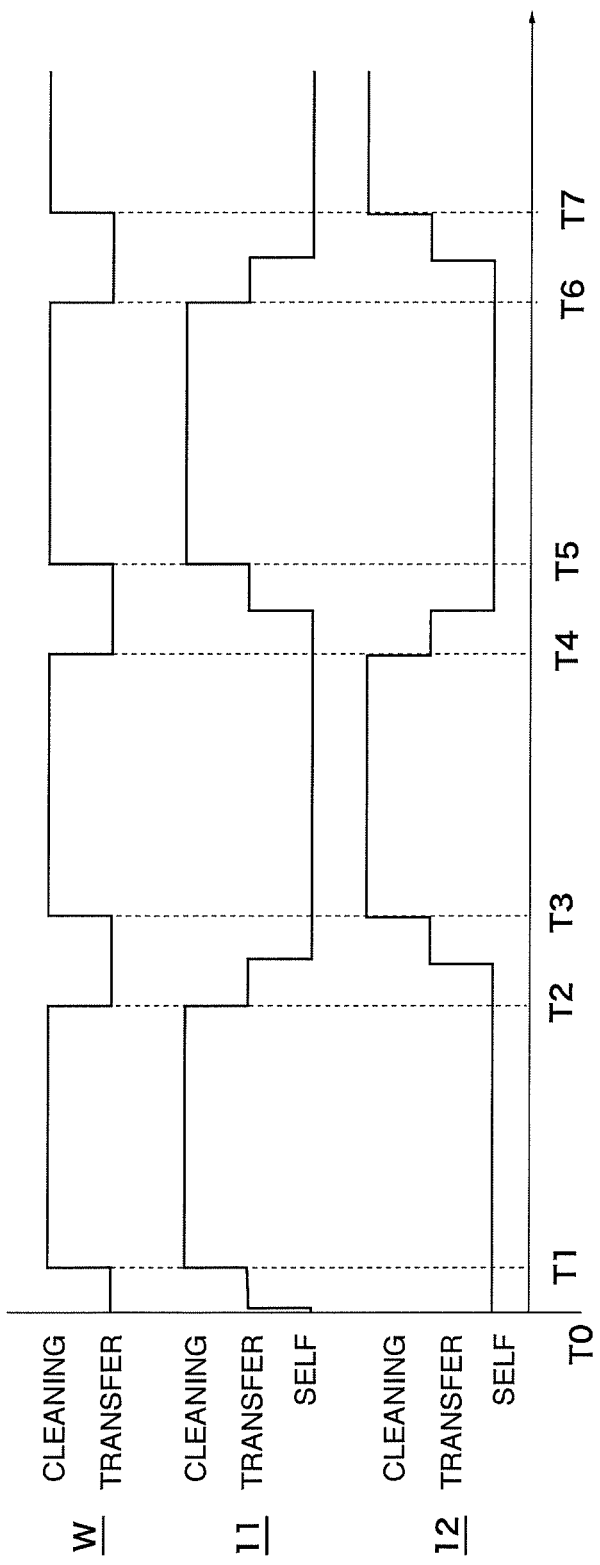

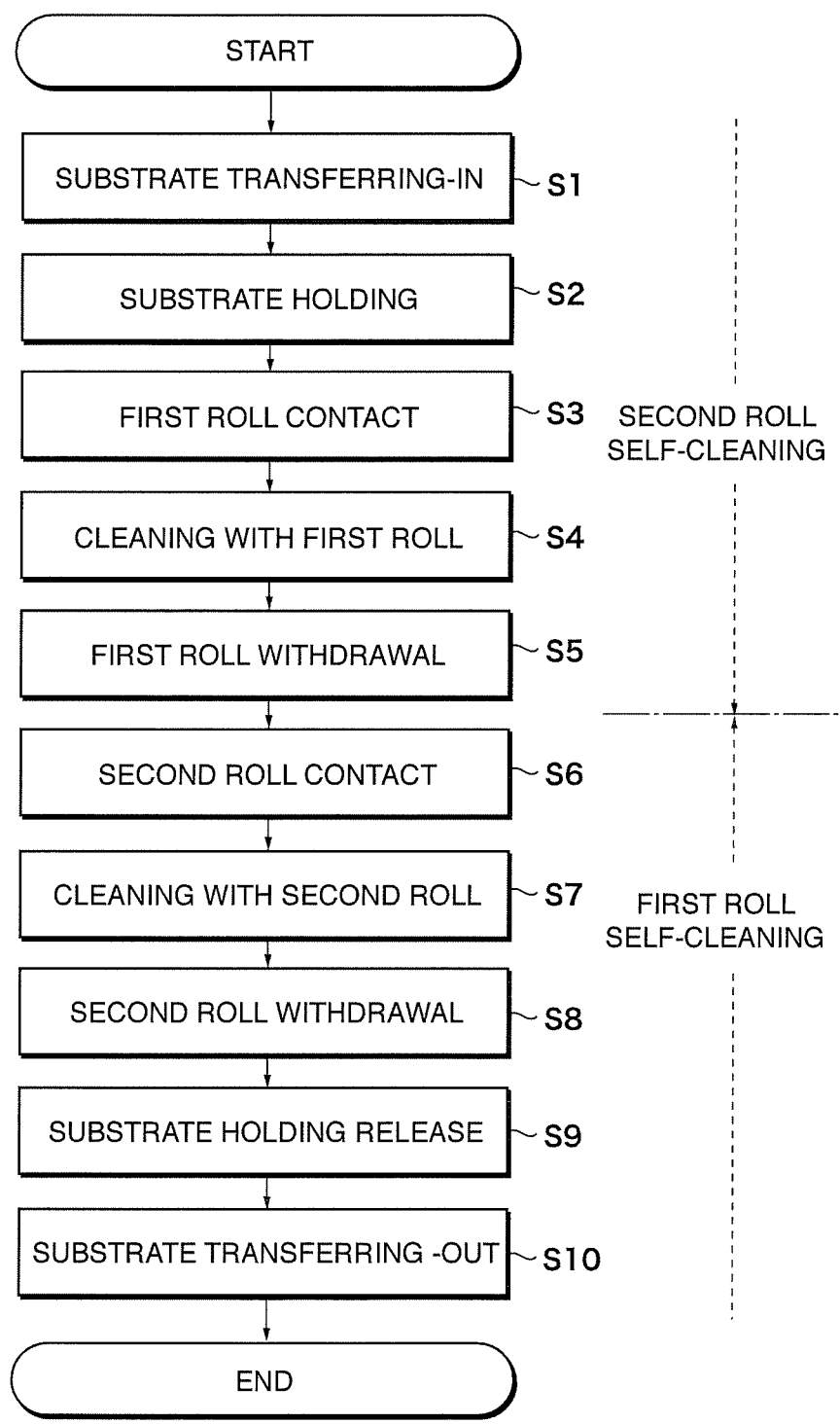

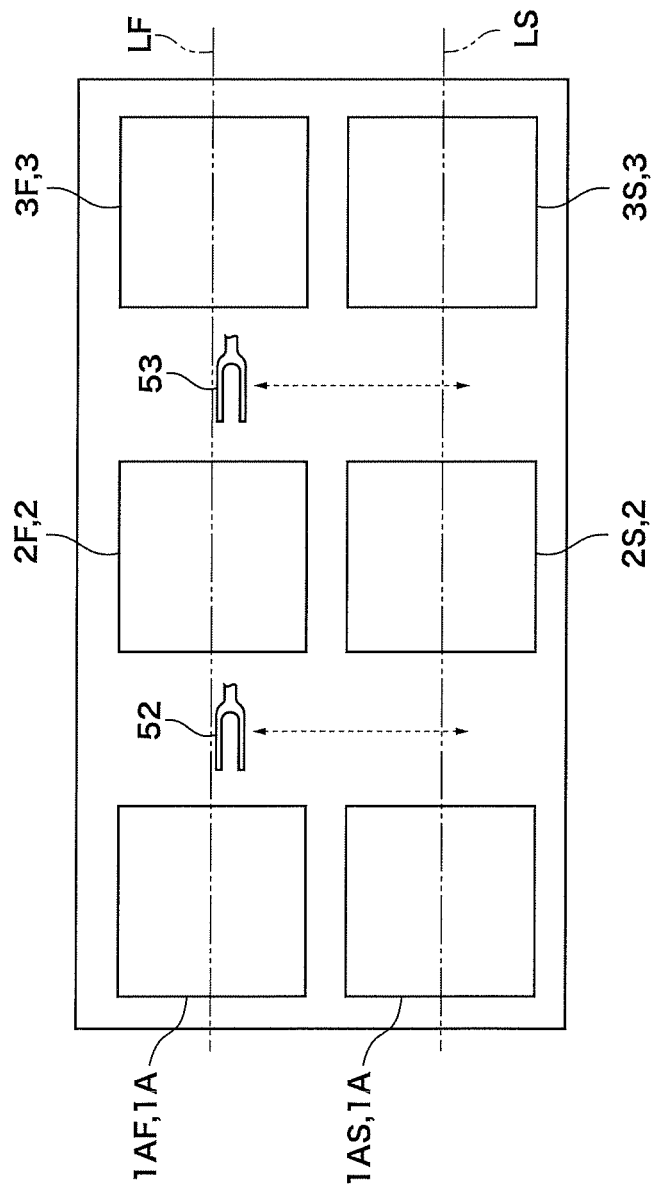

SUBSTRATE CLEANING DEVICE, SUBSTRATE CLEANING APPARATUS, METHOD FOR MANUFACTURING CLEANED SUBSTRATE AND SUBSTRATE PROCESSING APPARATUS

CROSS-REFERENCE TO RELATED APPLICATIONS

This application is a Divisional of U.S. application Ser. No. 14/334,394 filed on Jul. 17, 2014, which claims priority to Japanese Patent Application No. 2013-150506 filed Jul. 19, 2013 and Japanese Patent Application No. 2013-199471 filed Sep. 26, 2013, the disclosures of which are incorporated herein by reference in their entireties.

TECHNICAL FIELD

The present invention relates to a substrate cleaning device, a substrate cleaning apparatus, a method for manufacturing a cleaned substrate, and a substrate processing apparatus, and particularly, to a substrate cleaning device, a substrate cleaning apparatus, a method for manufacturing a cleaned substrate, and a substrate processing apparatus that shortens a time required for cleaning while performing cleaning using a clean cleaning member.

BACKGROUND ART

In substrates, such as a semiconductor wafer, polishing waste and a slurry remain on the surface of a substrate after copper plating processing or chemical mechanical polishing (CMP) processing of the surface. Thus, it is general that the substrate is cleaned with a substrate cleaning apparatus after the polishing of the substrate. As the cleaning apparatus that performs this cleaning processing, there is a cleaning apparatus that includes a roll type or pencil type cleaning member, and that performs cleaning of a substrate by rubbing the cleaning member against the rotating substrate while rotating the cleaning member, and that further includes a self-cleaning unit that cleans the cleaning member contaminated due to the cleaning of one substrate for cleaning of the next substrate (for example, refer to Patent Document 1). There is another substrate cleaning apparatus configured so that a front surface of a substrate is rubbed and cleaned with a sponge cleaning tool such as a pen sponge or a roll sponge while supplying a chemical to the front surface of the substrate, then a rinsing liquid, such as pure water, is supplied to the front surface of the substrate with the sponge cleaning tool being brought into contact with the front surface of the substrate (for example, refer to Patent Documents 2 and 3).

PRIOR ART DOCUMENT

Patent Document

[Patent document 1] JP-A-H10-323631
[Patent document 2] JP-A-2002-43267
[Patent document 3] JP-A-2010-74191

SUMMARY OF THE INVENTION

Problem to be Solved by the Invention

In recent years, the time required for polishing has tended to become shorter due to miniaturizing and thinning of a semiconductor device that is a CMP processing target, and there is also a demand for shortening the time required for cleaning for an improvement in throughput. However, if the time used for performing self-cleaning with the shortening of the cleaning time is shortened, there is a concern that cleaning of the cleaning member may become insufficient.

In view of the above-described problems, it is an object of the invention to provide a substrate cleaning device, a substrate cleaning apparatus, a method for manufacturing a cleaned substrate, and a substrate processing apparatus that can improve throughput while performing cleaning performed by a clean cleaning member.

Means for Solving the Problem

To achieve the above object, a substrate cleaning device according to the first aspect of the present invention includes, as shown in FIGS. 1A and 1B, for example, a substrate holding unit 10 configured to hold a substrate W, the substrate W having a first surface WA and a second surface WB, the second surface WB opposite to the first surface WA; a first cleaning unit 11 having a first cleaning member 11a, the first cleaning member 11a caused to come into contact with the first surface WA of the substrate W held by the substrate holding unit 10 to clean the first surface WA; a second cleaning unit 12 having a second cleaning member 12a, the second cleaning member 12a caused to come into contact with the first surface WA of the substrate W held by the substrate holding unit 10 to clean the first surface WA; and a controller 50 configured to control the first cleaning unit 11 and the second cleaning unit 12 so that, when any one of the first cleaning member 11a and the second cleaning member 12a cleans the first surface WA of the substrate W held by the substrate holding unit 10, the other cleaning member is at a position apart from the substrate W held by the substrate holding unit 10.

According to this configuration, it is possible to secure the time used for cleaning another cleaning member while one cleaning member is cleaning the first surface, and even if the time used for the cleaning of the first surface is shortened, it is possible to clean the first surface with the clean cleaning member.

As for the substrate cleaning device according to the second aspect of the present invention, as shown in FIGS. 1A and 1B, for example, in the substrate cleaning device 1 according to the first aspect of the present invention, the substrate cleaning device 1 further includes a pre-cleaning unit 15 and 16 configured to clean the first cleaning member 11a and the second cleaning member 12a before being providing for cleaning the first surface WA, in the substrate cleaning device 1, the controller 50 performs control so that the cleaning member out of the first cleaning member 11a and the second cleaning member 11b, which is not cleaning the first surface WA of the substrate W held by the substrate holding unit 10, is cleaned by the pre-cleaning unit 15 and 16.

According to this configuration, much pre-cleaning time for the cleaning units can be secured, and the cleanliness of the cleaning member before the first surface is cleaned can be improved.

As for the substrate cleaning device according to the third aspect of the present invention, as shown in FIGS. 1A and 1B, for example, in the substrate cleaning device 1 according to the first aspect of the present invention, the substrate cleaning device 1 further includes a chamber 40 configured to accommodate the substrate holding unit 10, the first cleaning unit 11, the second cleaning unit 12, and the pre-cleaning unit 15 and 16 therein; and a pulling-out mechanism 41 (42) capable of pulling out at least one of the first cleaning member 11a and the second cleaning member 12a, and the pre-cleaning unit 15 (16) with respect to the chamber 40.

According to this configuration, while cleaning the first surface with one cleaning member, maintenance of the other cleaning member can be performed, and down-time accompanying the maintenance can be shortened.

As for the substrate cleaning device according to the fourth aspect of the present invention, as shown in FIGS. 1A and 1B, for example, in the substrate cleaning device 1 according to any one of the first aspect to the third aspect of the present invention, the first cleaning unit 11 and the second cleaning unit 12 are configured so that a cleaning level when the first surface WA is cleaned by the second cleaning member 12a is higher than a cleaning level when the first surface WA is cleaned by the first cleaning member 11a.

According to this configuration, maintenance, such as cleaning or replacement, can be individually set according to the properties or situations of each of the cleaning members, and the life span of each of the cleaning members can be extended.

As for the substrate cleaning device according to the fifth aspect of the present invention, as shown in FIGS. 1A and 1B, for example, in the substrate cleaning device 1 according to any one of the first aspect to the fourth aspect of the present invention, the controller 50 controls the substrate holding unit 10, the first cleaning unit 11, and the second cleaning unit 12 so that, after the substrate W is held by the substrate holding unit 10, the first surface WA is cleaned by the first cleaning member 11a, the first surface WA is then cleaned by the second cleaning member 12a, and the holding of the substrate W by the substrate holding unit 10 is maintained from the start of the cleaning of the first surface WA by the first cleaning member 11a to the completion of the cleaning of the first surface WA by the second cleaning member 12a.

According to this configuration, it is not necessary to transfer a substrate when shifting is made from the cleaning performed by the first cleaning member to the cleaning performed by the second cleaning member while improving the cleaning performance of the first surface, total substrate transfer time can be shortened, and throughput can be improved.

As for a substrate cleaning apparatus according to the sixth aspect of the present invention includes, as shown in FIG. 4, for example, a plurality of the substrate cleaning devices 1A according to any one of the first aspect to the fifth aspect of the present invention; in the substrate cleaning apparatus, a first substrate cleaning device 1AF of the plurality of substrate cleaning devices 1A is arranged on a first cleaning line LF and a second substrate cleaning device 1AS of the plurality of substrate cleaning devices 1A is arranged on a second cleaning line LS separate from the first cleaning line LF; the substrate cleaning apparatus further includes: a first additional substrate processing section 2F (3F) arranged on the first cleaning line LF; and a second additional substrate processing section 2S (3) arranged on the second cleaning line LS. Here, the substrate cleaning apparatus may be configured such that the first substrate cleaning device 1AF and the second substrate cleaning device 1AS are configured so as to perform the same type of cleaning; the first additional substrate processing section is a first additional substrate cleaning device 2F that performs a different type of cleaning from the first substrate cleaning device 1AF; and the second additional substrate processing section is a second additional substrate cleaning device 2S that performs the same type of cleaning as the first additional substrate cleaning device 2F.

According to this configuration, the first cleaning line and the second cleaning line are provided with the substrate cleaning devices, respectively. Thus, even when cleaning to be performed by one module is performed in two steps, the cleaning can be performed in a single cleaning line without ranging over the other cleaning line, and processes can be performed in parallel.

As for a method for manufacturing a cleaned substrate according to the seventh aspect of the present invention, as shown in FIGS. 1A, 1B and 3, for example, the cleaned substrate as the substrate W after cleaning by cleaning a pre-cleaning substrate as the substrate W before the cleaning using the substrate cleaning device 1A according to any one of the first aspect to the fifth aspect of the present invention, the method includes: a substrate holding step (S2) of holding the substrate W with the substrate holding unit 10; a first cleaning step (S4) of cleaning the substrate W held by the substrate holding unit 10 with the first cleaning member 11a; a withdrawal step (S5) of withdrawing the first cleaning member 11a from the substrate W while the substrate holding unit 10 holds the substrate W after the first cleaning step (S4); and a second cleaning step (S7) of cleaning the substrate W held by the substrate holding unit 10 with the second cleaning member 12a after the withdrawal step (S5).

According to this configuration, it is not necessary to transfer a substrate when shifting is made from the cleaning performed by the first cleaning member to the cleaning performed by the second cleaning member, total substrate transfer time can be shortened, and throughput can be improved.

As for a substrate processing apparatus according to the eighth aspect of the present invention includes, as shown in FIG. 7, for example, the substrate cleaning device 1A according to any one of the first aspect to the fifth aspect of the present invention; and a substrate processing device 83 configured to process a substrate W (for example, see FIGS. 1A and 1B) before cleaning in the substrate cleaning device 1A. Otherwise, a substrate processing apparatus 100 may be configured to include, as shown in FIG. 7, for example, a substrate cleaning apparatus 104 according to the sixth aspect of the present invention, and a substrate processing device 83 that processes the substrate W (for example, see FIGS. 1A and 1B) before cleaning in the substrate cleaning apparatus 104.

According to this configuration, the substrate processing apparatus with improved throughput is obtained.

As for a substrate cleaning apparatus according to the ninth aspect of the present invention includes, as shown in FIG. 8, for example, a substrate holding part configured to hold and rotate a substrate; a sponge cleaning tool 842 configured to come into contact with a front surface of the substrate while the sponge cleaning tool is rotating around its own central axis; a chemical supply nozzle configured to supply a chemical liquid to the front surface of the substrate; and a chemical supply mechanism 853 configured to supply the chemical liquid directly to the sponge cleaning tool 842.

In a related-art substrate cleaning apparatus configured so that a front surface of a substrate is rubbed and cleaned with a sponge cleaning tool while supplying a chemical liquid to the front surface of the substrate, then a rinsing liquid, such as pure water, is supplied to the front surface of the substrate with the sponge cleaning tool being brought into contact with the front surface of the substrate, when the next substrate is cleaned, the rinsing liquid used in the rinsing processing of the previous substrate may ooze from the sponge cleaning tool, and may dilute the chemical liquid on the front surface of the substrate. For this reason, the concentration of the chemical liquid may decrease at an interface between the sponge cleaning tool and the front surface of the substrate, and cleaning performance may degrade. If a configuration similar to the substrate cleaning apparatus according to the ninth aspect of the present invention is adopted, the concentration decrease of the chemical liquid resulting from the presence of the rinsing liquid used for the cleaning of the previous substrate can be prevented.

According to the above configuration, it is possible to secure the time used for cleaning another cleaning member while one cleaning member is cleaning the first surface, and even if the time used for the cleaning of the first surface is shortened, it is possible to clean the first surface with the clean cleaning member.

BRIEF DESCRIPTION OF DRAWINGS

FIG. 2 is a time chart illustrating the operation of the substrate cleaning device related to the first embodiment of the present invention.

FIG. 3 is a flowchart illustrating the operation of the substrate cleaning device related to a modification example of the first embodiment of the present invention.

FIG. 4 is a schematic side view of a substrate cleaning apparatus related to a second embodiment of the present invention.

BEST MODE FOR CARRYING OUT THE INVENTION

Figure 1A:
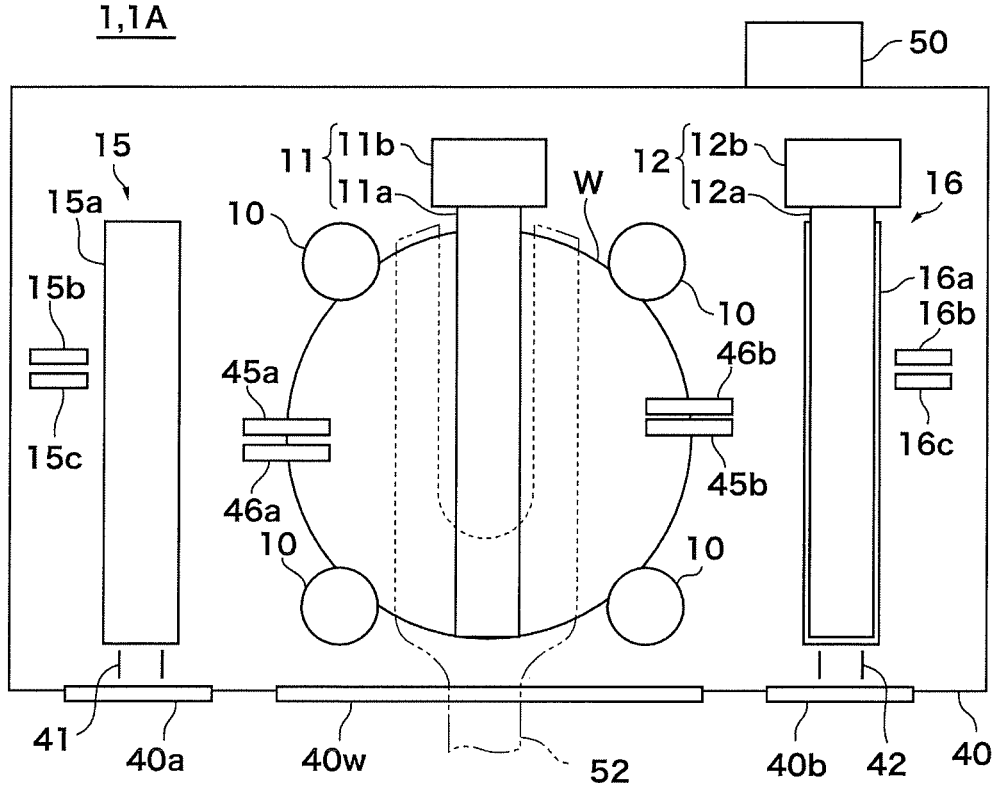
FIG. 1A is a plan view illustrating a schematic configuration of a substrate cleaning device related to a first embodiment of the present invention.

This application is based on the Patent Applications No. 2013-150506 filed on Jul. 19, 2013 in Japan and No. 2013-199471 filed on Sep. 26, 2013 in Japan, the contents of which are hereby incorporated in its entirety by reference into the present application, as part thereof.

The present invention will become more fully understood from the detailed description given hereinbelow. Further range of application of the present invention will become clearer from the detailed description given hereinbelow. However, the detailed description and the specific embodiment are illustrated of desired embodiments of the present invention and are described only for the purpose of explanation. Various changes and modifications will be apparent to those ordinary skilled in the art on the basis of the detailed description.

The applicant has no intention to give to public any disclosed embodiment. Among the disclosed changes and modifications, those which may not literally fall within the scope of the patent claims constitute, therefore, a part of the present invention in the sense of doctrine of equivalents.

Description will hereinafter be made of an embodiment of the present invention with reference to the drawings. The same or corresponding members are denoted with the same reference numerals in all the drawings, and their descriptions are not repeated.

Figure 1B:
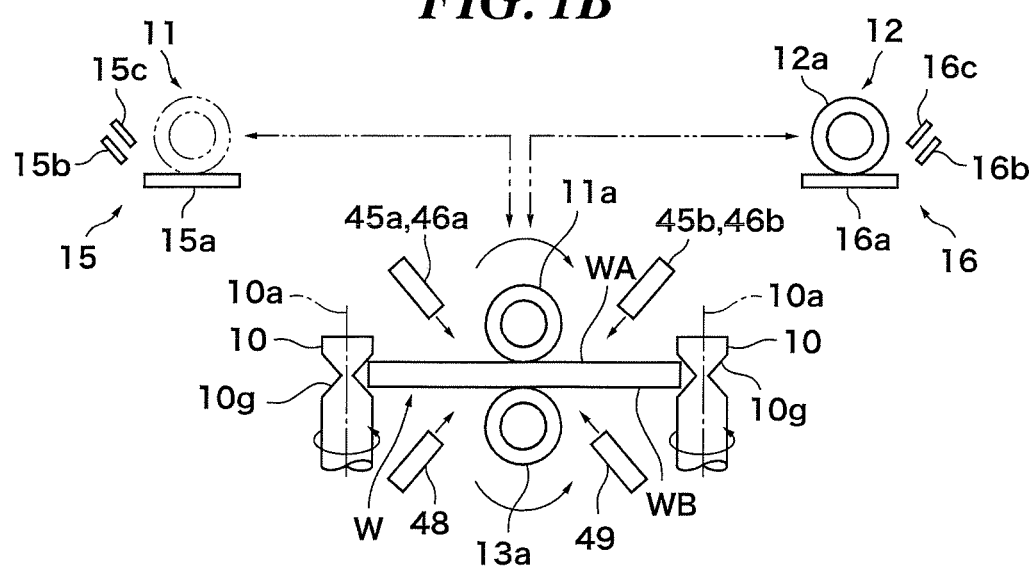
FIG. 1B is a side view illustrating a schematic configuration of the substrate cleaning device related to the first embodiment of the present invention.

First, with reference to FIGS. 1A and 1B, a substrate cleaning device 1 related to a first embodiment of the invention will be described. FIG. 1A is a plan view illustrating a schematic configuration of a substrate cleaning device 1, and FIG. 1B is a side view illustrating a schematic configuration of the substrate cleaning device 1. The substrate cleaning device 1 (hereinafter simply referred to as a "cleaning device 1") includes four rollers 10 as a substrate holding unit that holds a substrate W, a first cleaning unit 11, a second cleaning unit 12, a first self-cleaning unit 15 and a second self-cleaning unit 16 as a pre-cleaning unit, a chamber 40 that accommodates these units, and a controller 50. The substrate W to be cleaned by the substrate cleaning device has a front surface WA as a first surface and a rear surface WB as a second surface. In the present embodiment, a case where the substrate is a circular flat plate-shaped semiconductor substrate will be described. The substrate W is typically a circular substrate with a silicon dioxide film having grooves according to a wiring pattern formed on the front surface WA. For example, various films are formed on the silicon dioxide film such that a titanium nitride film or a tantalum nitride film is formed as a barrier metal on this silicon dioxide film, and a tungsten film or a copper film are formed on the barrier metal.

Each roller 10 is formed in a substantially columnar shape (especially round column), and is disposed so that the axis of the column is vertically set. A groove portion 10g formed with a groove having a width slightly greater than the thickness of the substrate W is formed over the whole circumference around an axis 10a, in the vicinity of an upper end of each roller 10 when the roller is vertically arranged. The width of the groove portion 10g that is slightly greater than the thickness of the substrate W is typically a width such that the substrate W can be stably held without difficulty in extraction and insertion of a peripheral edge portion of the substrate W from and into the groove portion 10g. The groove portion 10g is formed with a depth such that the substrate W does not come away easily when the substrate W is held. The four rollers 10 that are provided in the present embodiment are formed with the groove portions 10g with the same height, respectively. The four rollers 10 are configured so as to be able to hold the substrate W in a state where the front surface WA is in a horizontal plane.

Although the four rollers 10 are provided as described above in the present embodiment, the number of rollers may be three or may be five or more. Each roller 10 is configured so as to be able to rotate around the axis 10a, using a driving device (not shown), such as a servo motor. Additionally, when the peripheral edge portion of the substrate W is engaged with the groove portion 10g to hold the substrate W, each roller 10 is arranged at a position where the substrate W can be held with a force that can rotate the substrate W in a direction opposite to a rotational direction of each roller 10 by the rotation of each roller 10 around the axis 10a, without exerting an excessive deflection force on the substrate W. Additionally, the respective rollers 10 are arranged so as to be able to stably hold the substrate W within a range where the mutual positional relationship therebetween does not hinder movement of a robot hand 52 that conveys the substrate W. Each roller 10 is configured so as to be able to move between a holding position where the peripheral edge portion of the substrate W is engaged with the groove portion 10g and a releasing position where the peripheral edge portion of the substrate W is not engaged with the groove portion 10g.

The first cleaning unit 11 has a first roll sponge 11a as a first cleaning member that cleans the front surface WA of the substrate W, and a first moving unit 11b that moves the first roll sponge 11a. The first roll sponge 11a is a columnar sponge longer than the diameter of the substrate W. The first roll sponge 11a is disposed above the substrate W held by each roller 10 so that a longitudinal direction thereof is parallel to the substrate W. A side surface of the column of the first roll sponge 11a serves to clean the substrate W. Although the first roll sponge 11a is typically made of a porous PVA sponge, it may be made of a foamed urethane sponge, and particle removal capability becomes higher as the average diameter of holes formed in the sponge becomes smaller. The first roll sponge 11a is supported by the first moving unit 11b at one end of the column. The first roll sponge 11a is configured so as to be able to rotate around the axis of the column.

The first moving unit 11b has a rotating mechanism (not shown) that rotates the supported first roll sponge 11a around the axis. The first moving unit 11b is configured so as to be able to move the first roll sponge 11a between the position where the substrate W is cleaned and the position where the first self-cleaning unit 15 is disposed, through its own movement. In the present embodiment, the first moving unit 11b is configured so as to be able to vertically move between the position of the first roll sponge 11a where the first roll sponge 11a comes into contact with and cleans the substrate W held by each roller 10 and the position of the same height as that of the first self-cleaning unit 15 above the substrate W, and so as to be able to horizontally move between the position of the first self-cleaning unit 15 and the position where the substrate W is cleaned, looked in a plan view.

The second cleaning unit 12 is a cleaning unit separate from the first cleaning unit 11. In the present embodiment, the second cleaning unit 12 is configured similar to the first cleaning unit 11, and has a second roll sponge 12a as a second cleaning member that cleans the front surface WA of the substrate W, and a second moving unit 12b that moves the second roll sponge 12a. The second roll sponge 12a and the second moving unit 12b of the second cleaning unit 12 respectively correspond to the first roll sponge 11a and the first moving unit 11b of the first cleaning unit 11. The second roll sponge 12a is configured similar to the first roll sponge 11a, and operates similar to the first roll sponge 11a. The second moving unit 12b is configured similar to the first moving unit 11b, and operates similar to the first moving unit 11b except for horizontally moving between the position where the substrate W is cleaned and the position of a second self-cleaning unit 16, looked in a plan view.

The cleaning device 1 related to the present embodiment further has a third roll sponge 13a as a third cleaning member that cleans the rear surface WB of the substrate W. The third roll sponge 13a is also configured with the same material, size, and shape as the first roll sponge 11a and the second roll sponge 12a. The third roll sponge 13a is supported by a third moving unit (not shown) at one end of the column. The third moving unit (not shown) is configured so as to be able to move the third roll sponge 13a in the vertical direction between a position where the third roll sponge comes into contact with the rear surface WB of the substrate W held by each roller 10 and the position (lower position) where the third roll sponge is separated from the rear surface WB.

The first self-cleaning unit 15 is a unit that cleans the first roll sponge 11a contaminated due to the cleaning of the front surface WA of the substrate W. The self-cleaning performed by the first self-cleaning unit 15 makes the first roll sponge 11a itself clean before (pre-) being used for the cleaning of the front surface WA, and corresponds to pre-cleaning. In the present embodiment, the first self-cleaning unit 15 has a cleaning plate 15a, a pure-water nozzle 15b to supply pure water, and a chemical nozzle 15c to supply a chemical liquid for the self-cleaning. The cleaning plate 15a is a member suitable for removing foreign matter adhering to the first roll sponge 11a, and a quartz plate is used in the present embodiment. It is preferable that the first self-cleaning unit 15 typically further has a cleaning tank (not shown) to collect the pure water supplied from the pure-water nozzle 15b and the chemical liquid supplied from the chemical nozzle 15c without being scattered. The first self-cleaning unit 15 is configured so as to press the first roll sponge 11a on the cleaning plate 15a while spraying pure water and/or chemical liquid onto the first roll sponge 11a rotating around the axis, to thereby remove and clean off the foreign matter adhering to the first roll sponge 11a.

The second self-cleaning unit 16 is a unit to clean the second roll sponge 12a contaminated due to the cleaning of the front surface WA of the substrate W. The second self-cleaning unit 16 is configured similar to the first self-cleaning unit 15, and has a cleaning plate 16a, a pure-water nozzle 16b, and a chemical nozzle 16c in the present embodiment. The cleaning plate 16a, the pure-water nozzle 16b, and the chemical nozzle 16c in the second self-cleaning unit 16 respectively correspond to the cleaning plate 15a, the pure-water nozzle 15b, and the chemical nozzle 15c of the first self-cleaning unit 15, and are configured similar to the corresponding members.

In a plan view, the first self-cleaning unit 15 and the second self-cleaning unit 16 are disposed outside the substrate W held by each roller 10 and are line-symmetrically arranged with an imaginary straight line passing through the center of the substrate W held by each roller 10 as an axis so as to sandwich the substrate W between both the units. Although the first self-cleaning unit 15 and the second self-cleaning unit 16 are typically arranged at a higher position than the substrate W held by each roller 10 in the height direction, the units may not be higher than the substrate W held by each roller 10. The first cleaning unit 11 is configured so as to be able to move between the position on the front surface WA and the first self-cleaning unit 15. The second cleaning unit 12 is configured so as to be able to move between the position on the front surface WA and the second self-cleaning unit 16.

The cleaning device 1 related to the present embodiment further has two front surface chemical nozzles 45a and 45b to supply a chemical liquid to the front surface WA of the substrate W held by each roller 10, and two front surface rinse nozzles 46a and 46b to supply pure water to the front surface WA of the substrate W. In the present embodiment, the front surface chemical nozzle 45a and the front surface rinse nozzle 46a are arranged adjacent to each other, and the front surface chemical nozzle 45b and the front surface rinse nozzle 46b are arranged adjacent to each other. Also, the front surface chemical nozzle 45a and the front surface rinse nozzle 46a, and the front surface chemical nozzle 45b and the front surface rinse nozzle 46b are symmetrically arranged with the center of the substrate W held by each roller 10 as a center of symmetry. Additionally, the cleaning device 1 related to the present embodiment has a rear surface chemical nozzle 48 to supply a chemical liquid to the rear surface WB of the substrate W held by each roller 10, and a rear surface rinse nozzle 49 to supply pure water to the rear surface WB of the substrate W. The nozzles 45a, 45b, 46a, 46b, 48, and 49 are configured so as to discharge a chemical liquid or pure water when the respective roll sponges 11a, 12a, and 13a clean the front surface WA or the rear surface WB of the substrate W.

A chamber 40 is formed in a generally rectangular parallelepiped shape. The chamber 40 is provided with a transferring-in and transferring-out shutter 40w that forms an opening that allows entrance and exit of the substrate W with respect to the inside and outside of the chamber 40, a first shutter 40a that forms an opening that allows entrance and exit of the first roll sponge 11a and the first self-cleaning unit 15, and a second shutter 40b that forms an opening that allows entrance and exit of the second roll sponge 12a and the second self-cleaning unit 16. The opening of the chamber 40 opened and closed by the first shutter 40a is formed in a size such that entrance and exit of the first roll sponge 11a and the first self-cleaning unit 15 can be allowed, at a position where an extension line (imaginary straight line) is in contact with the chamber 40. The extension line (imaginary straight line) is obtained by extending the axis of the first roll sponge 11a at the position of the first self-cleaning unit 15 to a side opposite to the first moving unit 11b. The opening of the chamber 40 opened and closed by the second shutter 40b is formed in a size such that entrance and exit of the second roll sponge 12a and the second self-cleaning unit 16 can be allowed, at a position where an extension line (imaginary straight line) obtained by extending the axis of the second roll sponge 12a at the position of the second self-cleaning unit 16 to a side opposite to the second moving unit 12b is in contact with the chamber 40.

The opening of the chamber 40 opened and closed by the transferring-in and transferring-out shutter 40w is formed in a size such that entrance and exit of the substrate W held by the robot hand 52 can be allowed, between the first shutter 40a and the second shutter 40b. A first pulling-out mechanism 41 that guides the first self-cleaning unit 15 accommodating the first roll sponge 11a to the outside of the chamber 40 is provided between the first shutter 40a and the first self-cleaning unit 15. A second pulling-out mechanism 42 that guides the second self-cleaning unit 16 accommodating the second roll sponge 12a to the outside of the chamber 40 is provided between the second shutter 40b and the second self-cleaning unit 16. In addition, a direction in which entrance and exit of the first roll sponge 11a and the first self-cleaning unit 15 is allowed, a direction in which entrance and exit of the second roll sponge 12a and the second self-cleaning unit 16 is allowed, and a direction in which entrance and exit of the substrate W held by the robot hand 52 is allowed can be appropriately changed according to the installation aspect of the cleaning device 1 without being limited to the directions illustrated in FIG. 1A.

The controller 50 is configured so as to be able to control the movement of each roller 10 in a plan view and the rotation of each roller 10 around the axis 10a, to thereby control the holding and releasing of the substrate W by each roller 10, and the rotation of the substrate W within a horizontal plane. Additionally, the controller 50 is configured so as to be able to control the rotation of the first roll sponge 11a and the second roll sponge 12a and the movement of the first moving unit 11b and the second moving unit 12b. Additionally, the controller 50 is configured so as to be able to control the start and stop of the first self-cleaning unit 15 and the second self-cleaning unit 16. Additionally, the controller 50 is configured so as to be able to control the presence or absence of supply of a chemical liquid or pure water from the two front surface chemical nozzles 45a and 45b, the two front surface rinse nozzles 46a and 46b, the rear surface chemical nozzle 48, and the rear surface rinse nozzle 49. Additionally, the controller 50 is configured so as to be able to control the opening and closing of the transferring-in and transferring-out shutter 40w.

Next, with reference to FIG. 2, the operation of the cleaning device 1 will be described. FIG. 2 is a time chart of the operation of the cleaning device 1. In the following description, FIGS. 1A and 1B will be appropriately referred to when the configuration of the cleaning device 1 is mentioned. Additionally, the operation of constituent members of the cleaning device 1 is controlled by the controller 50. During the stoppage of the cleaning device 1, the first cleaning unit 11 is at the position of the first self-cleaning unit 15, and the second cleaning unit 12 is at the position of the second self-cleaning unit 16 (T0). At this time, there is no substrate W within the chamber 40. When the cleaning device 1 starts its operation, the substrate W is transferred into the chamber 40 by the robot hand 52, and the transferred-in substrate W is held and rotated by each roller 10 with the front surface WA being directed upward (T0 to T1). The rotation of the substrate W is performed with the rotation of each roller 10 around the axis 10a. Incidentally, when the substrate W is held by each roller 10, the robot hand 52 is withdrawn from the chamber 40.

While the above-described substrate W is transferred, the first cleaning unit 11 moves from the position of the first self-cleaning unit 15 to the position of the substrate W held and rotated by each roller 10, and the first roll sponge 11a comes into contact with the front surface WA of the substrate W (T1). The detailed movement of the first cleaning unit 11 in this case is as follows. The first cleaning unit 11 first moves upward at the position of the first self-cleaning unit 15, and thereby the first roll sponge 11a is separated from the cleaning plate 15a. Next, the first cleaning unit 11 moves horizontally and moves down after that, and thereby, the first roll sponge 11a comes into contact with the front surface WA of the substrate W. It is preferable that the movement of the first cleaning unit 11 be performed in parallel to the transfer of the substrate W from a viewpoint of improving throughput. Additionally, the first roll sponge 11a may be in contact with the front surface WA after the rotating speed of the substrate W reaches a predetermined rotating speed suitable for the next cleaning processing from a viewpoint of inhibiting an adverse influence from being exerted on cleaning performance, such as an increase in number of defects. Moreover, it is preferable that the controller 50 control the movement of the first moving unit 11b so that the first roll sponge 11a is brought into contact with the front surface WA without delay (typically, simultaneously with reaching the predetermined rotating speed) after the rotating speed of the substrate W reaches a predetermined rotating speed, from a viewpoint of improving throughput.

When the first roll sponge 11a comes into contact with the rotating substrate W, a chemical liquid is supplied from each of the front surface chemical nozzles 45a and 45b to the front surface WA, and pure water is supplied from each of the front surface rinse nozzles 46a and 46b to the front surface. When the first roll sponge 11a comes into contact with the rotating substrate W to which the chemical liquid and the pure water has been supplied, and rotates around the axis, cleaning of the front surface WA is performed (T1 to T2). While the cleaning of the front surface WA is performed by the first roll sponge 11a, the second roll sponge 12a is self-cleaned at the position of the second self-cleaning unit 16 separated from the substrate W.

The following operation is performed in a period from when the cleaning of the substrate W is completed to when the cleaning of the next substrate W begins (T2 to T3). First, the first roll sponge 11a is separated from the rotating substrate W. Then, the substrate W is stopped in rotation with the stopping of the rotation of each roller 10 around the axis 10a, and is transferred out of the chamber 40 by the robot hand 52. After the substrate W cleaned in the cleaning device 1 is transferred out, another non-cleaned substrate W is transferred into the chamber 40 by the robot hand 52. The transferred-in substrate W is held and rotated by each roller 10. In the meantime, the first cleaning unit 11 moves to the position of the first self-cleaning unit 15 through the movement reverse to the movement when having moved from the position of the first self-cleaning unit 15 to the front surface WA of the substrate W, and the self-cleaning of the first roll sponge 11a is started. On the other hand, the second cleaning unit 12 ends the self-cleaning of the second roll sponge 12a, and moves from the position of the second self-cleaning unit 16 to the position of the substrate W held by each roller 10, and the second roll sponge 12a comes into contact with the front surface WA of the rotating substrate W. Meanwhile, since the second roll sponge 12a is self-cleaned while the cleaning of the front surface WA by the first roll sponge 11a is performed (T1 to T2), the second roll sponge is brought into a sufficiently clean state. Incidentally, the timing of the movement (upward movement, horizontal movement, and downward movement) of the second cleaning unit 12 and the timing at which the second roll sponge 12a comes into contact with the front surface WA are the same as the timings of operation of the above-described first cleaning unit 11. Additionally, when the first cleaning unit 11 and the second cleaning unit 12 move, respectively, the timings thereof are adjusted by the controller 50 so as not to interfere with each other.

When the second roll sponge 12a has come into contact with the rotating substrate W, the cleaning of the front surface WA by the second cleaning unit 12 is performed (T3 to T4) in the same way as the above-described cleaning of the front surface WA by the first cleaning unit 11. In other words, the cleaning during a time period T3 to T4 is the cleaning where the first roll sponge 11a used in the cleaning performed during a time period T1 to T2 is substituted with the second roll sponge 12a. While the cleaning of the front surface WA is performed by the second roll sponge 12a, the self-cleaning of the first roll sponge 11a at the position of the first self-cleaning unit 15 separated from the substrate W continues.

While the cleaning of the substrate W ends and the cleaning of the next substrate W begins (T4 to T5), substantially the same operation as the transfer performed during the time period T2 to T3 is performed. The point that the transfer to be performed during the time period T4 to T5 is different from the transfer performed during the time period T2 to T3 is a point that the first cleaning unit 11 and the second cleaning unit 12 are replaced with each other. That is, first, the second roll sponge 12a is separated from the rotating substrate W. Then, the substrate W is stopped in rotation and is transferred out to the outside of the chamber 40 by the robot hand 52, another non-cleaned substrate W is instead transferred into the chamber 40, and the substrate W is held and rotated by each roller 10. In the meantime, the second cleaning unit 12 moves to the position of the second self-cleaning unit 16, and self-cleaning of the second roll sponge 12a is started. On the other hand, the first cleaning unit 11 ends the self-cleaning of the first roll sponge 11a and moves from the position of the first self-cleaning unit 15 to the position of the substrate W, and the first roll sponge 11a comes into contact with the front surface WA of the rotating substrate W.

Thereafter, the same cleaning as the cleaning during the time period T1 to T2 is performed during a time period T5 to T6, the same transfer as the transfer during the time period T2 to T3 is performed during a time period T6 to T7, and the subsequent operations are similarly repeated. In addition, although the description was omitted in the explanation referring to FIG. 2 up to now, when the front surface WA is cleaned (T1 to T2, T3 to T4, . . . ), the cleaning of the rear surface WB is also performed as the third roll sponge 13a comes into contact with the rear surface WB, the chemical is supplied from the rear surface chemical nozzle 48, and pure water is supplied from the rear surface rinse nozzle 49. Additionally, when the transfer of the substrate W is performed (T2 to T3, T4 to T5, . . . ), the third roll sponge 13a is moved up and down such that the third roll sponge 13a is separated and withdrawn downward from the substrate W held by each roller 10, replacement of the substrate W is performed, and a non-cleaned substrate W is held and rotated by each roller 10, and then the third roll sponge 13a moves upward and is in contact with the rear surface WB. In the present embodiment, the third roll sponge 13a is configured so that pre-cleaning, such as self-cleaning is not performed. The third roll sponge 13a may be, however, configured so that pre-cleaning is performed when the third roll sponge is downward withdrawn.

In the cleaning device 1 described above, while one roll sponge (for example, the first roll sponge 11a) is cleaning the front surface WA of the substrate W, another roll sponge (for example, the second roll sponge 12a) continues being self-cleaned. Thus, self-cleaning time is not restricted by the transfer time of the substrate W. For this reason, the cleaning of the substrate W can be started immediately after the transfer of the substrate W into the chamber 40 while sufficiently ensuring time used for performing self-cleaning of each of the roll sponges, and throughput can be improved without lowering cleaning levels. Additionally, when the maintenance of the first cleaning unit 11 or the second cleaning unit 12 is performed such that a roll sponge, which has completed its life span, is replaced, the maintenance is performed by pulling out the cleaning unit, which is being self-cleaned, from the chamber 40, so that the cleaning of the substrate W can be continued with the roll sponge of the other cleaning unit while performing the maintenance of the cleaning unit, and the down-time of the cleaning device 1 caused by the maintenance can be reduced.

In the above description, although the first roll sponge 11a and the second roll sponge 12a are identical in the above description, these roll sponges may be configured to have different types of performance. For example, the second roll sponge 12a is configured so as to have higher cleaning performance than the first roll sponge 11a such that the average diameter of the holes formed in the second roll sponge 12a is smaller than the average diameter of the holes formed in the first roll sponge 11a, the first roll sponge 11a is used for rough cleaning, and the second roll sponge 12a is used for finish cleaning. In this way, the cleaning device in which the first roll sponge 11a and the second roll sponge 12a are made to have different levels of cleaning is referred to as a cleaning device 1A, and is distinguished from the aforementioned cleaning device 1. The cleaning device 1A has the same configuration as the cleaning device 1 except that the cleaning levels of the first roll sponge 11a and the second roll sponge 12a are different from each other. Hereinafter, a typical operation example of the cleaning device 1A will be described.

FIG. 3 is a flowchart illustrating the operation of the cleaning device 1A related to a modification example of the first embodiment of the invention. In the following description, FIGS. 1A and 1B will be appropriately referred to when the configuration of the cleaning device 1A is mentioned. Additionally, the operation of constituent members of the cleaning device 1A is controlled by the controller 50. During the stoppage of the cleaning device 1A, the first cleaning unit 11 is at the position of the first self-cleaning unit 15, the second cleaning unit 12 is at the position of the second self-cleaning unit 16, and there is no substrate W within the chamber 40. When the cleaning device 1A starts its operation, the substrate W is transferred into the chamber 40 by the robot hand 52 (S1). The transferred-in substrate W is held and rotated by each roller 10 (substrate holding step; S2). In addition, when the substrate W is held by each roller 10, the robot hand 52 is withdrawn from the chamber 40.

While the above-described substrate W is transferred, the first cleaning unit 11 moves from the position of the first self-cleaning unit 15 to the position of the substrate W held and rotated by each roller 10, and the first roll sponge 11a comes into contact with the front surface WA of the substrate W (S3). The operation up to now is the same as that of the cleaning device 1 including the timing of the transferring-in of the substrate W and movement of the first cleaning unit 11, and the timing of the increase of the rotating speed of the substrate W and contact of the first roll sponge 11a with the front surface WA, or the like. When the first roll sponge 11a comes into contact with the front surface WA, the rough cleaning of the front surface WA is performed (first cleaning step; S4). During the rough cleaning of the front surface WA (S4), typically, a chemical liquid is supplied to the front surface WA from each of the front surface chemical nozzles 45a and 45b. However, pure water may be supplied from each of the front surface rinse nozzles 46a and 46b. In the cleaning device 1A, similar to the cleaning device 1, the second roll sponge 12a is also self-cleaned by the second self-cleaning unit 16 while the first roll sponge 11a is cleaning the front surface WA.

After the rough cleaning of the front surface WA (S4) is completed, the first roll sponge 11a is separated from the front surface WA and is moved to the first self-cleaning unit 15 (withdrawal step; S5). When the first roll sponge 11a is withdrawn from the front surface WA, the second cleaning unit 12 at the position of the second self-cleaning unit 16 moves to the position of the rotating substrate W and comes into contact with the front surface WA so as to be replaced with the first roll sponge 11a (S6). During a period from when the first roll sponge 11a is withdrawn from the front surface WA to when the second roll sponge 12a comes into contact with the front surface WA, the substrate W maintains a state where the substrate W is held by each roller 10. At this time, the rotating speed of the substrate W is also typically maintained at a predetermined rotating speed. After the first roll sponge 11a is withdrawn from the front surface WA, as long as the substrate W restores the predetermined rotating speed by the time when the second roll sponge 12a comes into contact with the front surface WA, the rotating speed may be temporarily reduced (including to zero).

When the second roll sponge 12a comes into contact with the front surface WA, the finish cleaning of the front surface WA is performed (second cleaning step; S7). During the finish cleaning of the front surface WA (S7), typically, pure water is supplied from each of the front surface rinse nozzles 46a and 46b to the front surface WA. However, a chemical liquid may be supplied from each of the front surface chemical nozzles 45a and 45b. In the cleaning device 1A, similar to the cleaning device 1, the first roll sponge 11a is also self-cleaned by the first self-cleaning unit 15 while the second roll sponge 12a is cleaning the front surface WA. When the finish cleaning (S7) of the front surface WA is completed, the second roll sponge 12a is separated from the front surface WA and is moved to the second self-cleaning unit 16 (S8). When the second roll sponge 12a is separated from the front surface WA, the rotation of the substrate W is stopped and the holding of the substrate W by each roller 10 is released (S9). The substrate W, the holding of which is released, is transferred out to the outside of the chamber 40 by the robot hand 52 (S10). In addition, although the description was omitted in the explanation referring to FIG. 3 up to now, when the front surface WA is cleaned (S4, S7), similar to the cleaning device 1, the cleaning of the rear surface WB is also performed as a chemical liquid and/or pure water is supplied while the third roll sponge 13a comes into contact with the rear surface WB.

In the cleaning device 1A that operates as described above, two types of cleaning including the rough cleaning and the finish cleaning can be completed by one module, it is not necessary to transfer the substrate W when shifting is made from the rough cleaning to the finish cleaning, and total substrate transfer time can be shortened to improve throughput. Additionally, in a case where a time period required for the rough cleaning and a time period required for the finish cleaning are different from each other, if the rough cleaning and the finish cleaning are performed by separate modules, throughput is governed by longer cleaning time. However, the throughput is not governed by the longer cleaning time in the cleaning device 1A related to the present modification example. Additionally, in the cleaning device 1A, whether the chemical liquid is supplied or whether pure water is supplied can be changed in the rough cleaning and the finish cleaning, and the degrees of freedom of a process can be enhanced. In addition, similar to the cleaning device 1, the cleaning device 1A also has the two cleaning members (11a, 12a) with respect to one module, and thus, the time taken to perform the self-cleaning can be sufficiently secured and lowering of cleaning levels can be avoided.

In the above description, the cleaning devices 1 and 1A have the third roll sponge 13a (third cleaning member) that cleans the rear surface WB of the substrate W. However, when the rear surface WB does not need to be cleaned, the third roll sponge 13a may not be provided. On the contrary, the cleaning devices 1 and 1A may have a fourth cleaning member that cleans the rear surface WB of the substrate W, in addition to the third cleaning member (the third roll sponge 13a in the present embodiment). In this case, a pre-cleaning unit that performs pre-cleaning, such as self-cleaning, on the third cleaning member and the fourth cleaning member may be further provided, the third cleaning member and the fourth cleaning member may alternately perform cleaning of the rear surface WB similar to the operation of the first roll sponge 11a and the second roll sponge 12a, and a cleaning member that is not performing the cleaning the rear surface WB may be pre-cleaned.

Next, with reference to FIG. 4, a substrate cleaning apparatus 104 related to a second embodiment of the invention will be described. FIG. 4 is a schematic configuration diagram of the substrate cleaning apparatus 104. The substrate cleaning apparatus 104 includes two of the aforementioned cleaning devices 1A, two substrate cleaning devices 2 (hereinafter simply referred to as "cleaning devices 2"), and two drying devices 3. The substrate cleaning apparatus 104 further includes a first robot hand 52 and a second robot hand 53. Although the two cleaning devices 1A have the same configuration, in order to distinguish both the cleaning devices from each other, one cleaning device 1A may be referred to as a "cleaning device 1AF", and the other cleaning device 1A may be referred to as a "cleaning device 1AS". When characteristics common to both the cleaning devices 1AF and 1AS are mentioned, they are generically referred to as the "cleaning devices 1A". In the two cleaning devices 2 having the same configuration, similarly, one cleaning device 2 may be referred to as a "cleaning device 2F", the other cleaning device 2 may be referred to as a "cleaning device 2S", and both the cleaning devices are generically referred to as the "cleaning devices 2". In the two drying devices 3 having the same configuration, similarly, one drying device 3 may be referred to as a "drying device 3F", the other drying device 3 may be referred to as a "drying device 3S", and both the drying devices are generically referred to as the "drying devices 3".

Figure 5A:
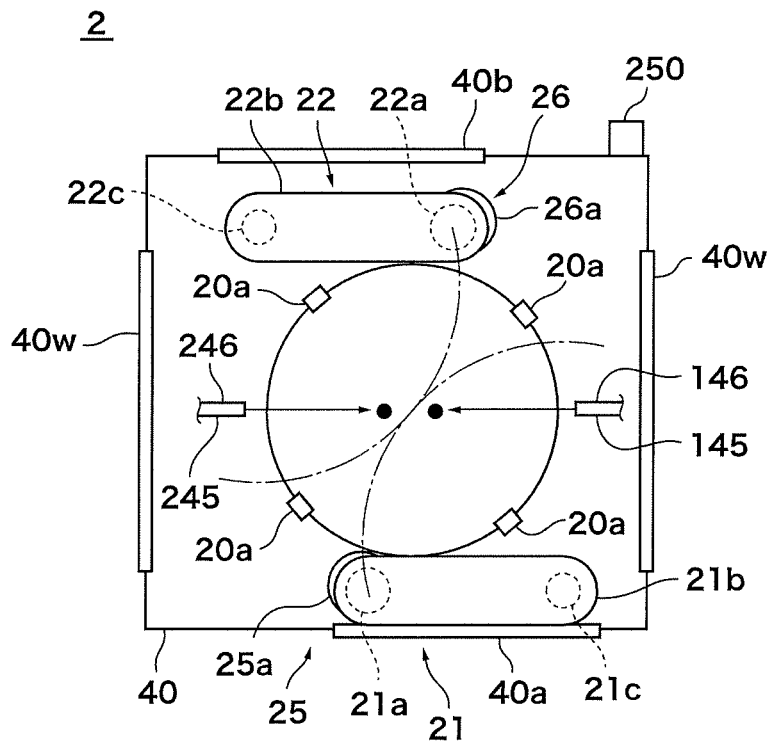
FIG. 5A is a plan view illustrating a schematic configuration of a substrate cleaning device related to a modification example of the first embodiment of the present invention.
Figure 5B:
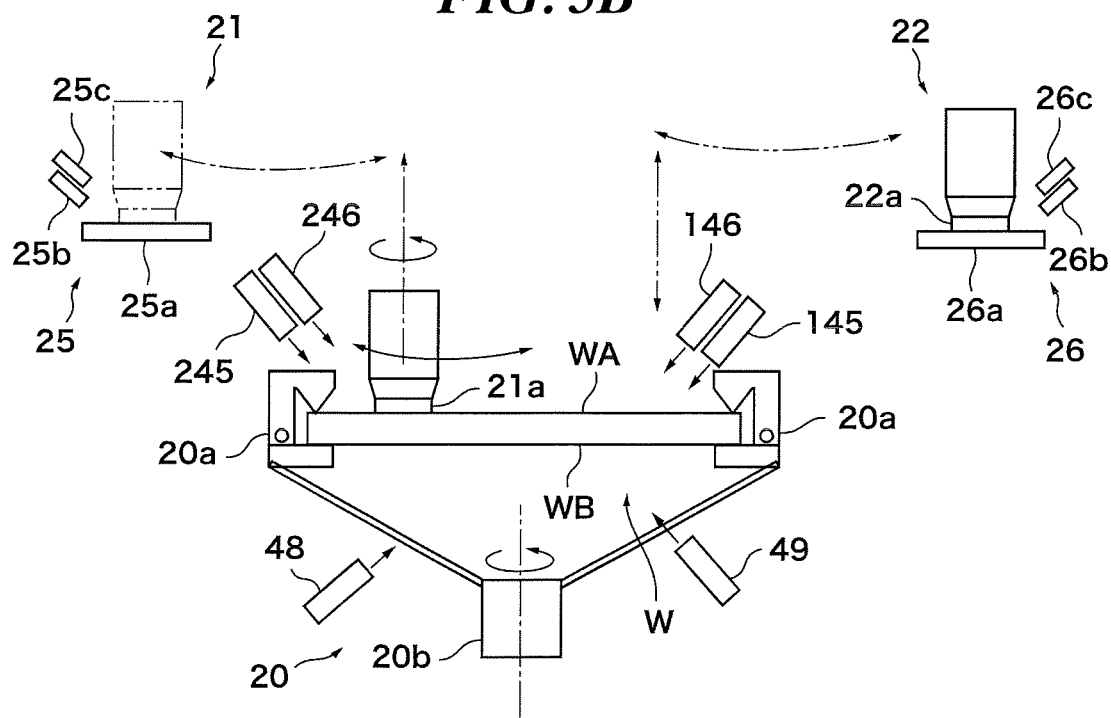
FIG. 5B is a side view illustrating the schematic configuration of the substrate cleaning device related to the modification example of the first embodiment of the present invention.

Here, with reference to FIGS. 5A and 5B, the configuration of the cleaning device 2 will be described. FIG. 5A is a plan view illustrating a schematic configuration of a cleaning device 2 and FIG. 5B is a side view illustrating a schematic configuration of the cleaning device 2. The main difference of the cleaning device 2 as compared to the cleaning device 1A (see FIGS. 1A and 1B) is that the cleaning device 2 includes a first cleaning unit 21 having a pencil-type first pen sponge 21a and a second cleaning unit 22 having a pencil-type second pen sponge 22a, instead of the first cleaning unit 11 having the columnar first roll sponge 11a and the second cleaning unit 12 having the columnar second roll sponge 12a, which are included in the cleaning device 1A. The cleaning device 2 includes a chuck 20 as a substrate holding unit that holds the substrate W, the above-described first cleaning unit 21, the above-described second cleaning unit 22, a first self-cleaning unit 25, a second self-cleaning unit 26, the chamber 40 that accommodates these units, and a controller 250. The cleaning device 2 is one form of the substrate cleaning device. In the cleaning device 2, the first cleaning unit 21 corresponds to the first cleaning unit, the second cleaning unit 22 corresponds to the second cleaning unit, and the first self-cleaning unit 25 and the second self-cleaning unit 26 correspond to the pre-cleaning unit.

The chuck 20 has a plurality of chuck claws 20a and a rotational driving shaft 20b. The plurality of chuck claws 20a are provided so as to grip the outer peripheral end portion (edge portion) of the substrate W to hold the substrate W. In the present embodiment, four chuck claws 20a are provided, and a gap that does not hinder the movement of each of the robot hands 52 and 53 (refer to FIG. 4) that convey the substrate W is provided between adjacent chuck claws 20a. Each chuck claw 20a is connected to the rotational driving shaft 20b so as to be able to hold the substrate W the surface of which is kept horizontal. In the present embodiment, the substrate W is held by the four chuck claws 20a so that the front surface WA is turned upward. The rotational driving shaft 20b is configured so as to be able to rotate around an axis extending perpendicularly to the surface of the substrate W and rotate the substrate W within a horizontal plane through the rotation of the rotational driving shaft 20b around the axis.

The first cleaning unit 21 has the first pen sponge 21a, a first arm 21b that supports the first pen sponge 21a, and a first moving unit 21c that moves the first arm 21b. The first pen sponge 21a corresponds to the first cleaning member. The first pen sponge 21a is a columnar sponge that is smaller in both length and diameter than the first roll sponge 11a (see FIGS. 1A and 1B). The first pen sponge 21a is disposed above the substrate W held by the chuck 20 such that an axis thereof is perpendicular to the front surface WA. The first pen sponge 21a is formed such that the length of the first pen sponge 21a is smaller than the diameter thereof. A columnar end surface of the first pen sponge 21a serves as a surface that cleans the substrate W. Although the same material as the first roll sponge 11a can be used for the first pen sponge 21a, the first pen sponge 21a may be formed from a different material. The first pen sponge 21a is supported by the first arm 21b at an end surface opposite to the surface that cleans the substrate W.

The first arm 21b is a flat bar-shaped member longer than the radius of the substrate W. The first arm 21b is typically disposed so that a longitudinal direction thereof is parallel to the front surface WA. The first arm 21b supports the first pen sponge 21a at one end, and has the first moving unit 21c connected to the other end. The first arm 21b supports the first pen sponge 21a so as to be rotatable around the axis thereof. The first moving unit 21c is a member that vertically moves the first arm 21b up and down and swings the first arm 21b in a horizontal direction. The swinging of the first arm 21b in the horizontal direction by the first moving unit 21c is an aspect in which the track of the first pen sponge 21a draws a circular arc with a connecting portion of the first arm 21b with the first moving unit 21c as a center. In this case, the first arm 21b and the first moving unit 21c are disposed so that the first pen sponge 21a passes through the center of the front surface WA. Additionally, the first moving unit 21c has a motor (not shown), and is configured so as to be able to move the first arm 21b vertically and horizontally as mentioned above to thereby move the first pen sponge 21a between the position on the front surface WA where the substrate W is cleaned and the position of the first self-cleaning unit 25.

The second cleaning unit 22 has the second pen sponge 22a, a second arm 22b, and a second moving unit 22c. In the present embodiment, the second cleaning unit 22 is configured similar to the first cleaning unit 21 except for the second pen sponge 22a. In the second cleaning unit 22, the second arm 22b and the second moving unit 22c respectively correspond to the first arm 21b and the first moving unit 21c of the first cleaning unit 21. In a plan view, the second cleaning unit 22 is disposed so that the second moving unit 22c is symmetrical to the first moving unit 21c, with the center of the substrate W held by the chuck 20 as a center of symmetry. Although the second pen sponge 22a is configured with a performance different from the first pen sponge 21a, the shape thereof is the same as that of the first pen sponge 21a. The second pen sponge 22a is configured so as to have higher cleaning performance than the first pen sponge 21a such that the second pen sponge 22a has holes smaller than the average diameter of the holes formed in the first pen sponge 21a. By virtue of such a configuration, typically, the first pen sponge 21a is used for rough cleaning, and the second pen sponge 22a is used for finish cleaning. The second pen sponge 22a corresponds to the second cleaning member.

The first self-cleaning unit 25 has a cleaning plate 25a, a pure-water nozzle 25b, and a chemical nozzle 25c, similar to the first self-cleaning unit 15 of the cleaning device 1A (see FIGS. 1A and 1B). Typically, the first self-cleaning unit 25 further has a cleaning tank (not shown). The cleaning plate 25a is formed with a size suitable for removing foreign matter adhering to the first pen sponge 21a, and a quartz plate is used in the present embodiment. The first self-cleaning unit 25 is configured so as to press the first pen sponge 21a on the cleaning plate 25a while spraying pure water and/or a chemical liquid onto the first pen sponge 21a rotating around the axis thereof, to thereby remove and clean off the foreign matter adhering to the first pen sponge 21a.

The second self-cleaning unit 26 is configured similar to the first self-cleaning unit 25, and has a cleaning plate 26a, a pure-water nozzle 26b, and a chemical nozzle 26c. Typically, the second self-cleaning unit 26 further has a cleaning tank (not shown). In the second cleaning unit 22, the cleaning plate 26a, the pure-water nozzle 26b, and the chemical nozzle 26c respectively correspond to the cleaning plate 25a, the pure-water nozzle 25b, and the chemical nozzle 25c of the first self-cleaning unit 21, and are configured similar to corresponding members. In a plan view, the second self-cleaning unit 26 is disposed so that the cleaning plate 26a is symmetrical to the cleaning plate 25a, with the center of the substrate W held by the chuck 20 as a center of symmetry.

The cleaning device 2 related to the present embodiment further has a first front surface chemical nozzle 145 supplying a chemical liquid and a first front surface rinse nozzle 146 supplying pure water when the front surface WA is cleaned with the first pen sponge 21a, and a second front surface chemical nozzle 245 supplying chemical liquid and a second front surface rinse nozzle 246 supplying pure water when the front surface WA is cleaned with the second pen sponge 22a, and the chemical liquid and the pure water are respectively supplied to the front surface WA of the substrate W held by the chuck 20.

The chamber 40 is formed in a generally rectangular parallelepiped shape, and the first shutter 40a, the second shutter 40b, and two transferring-in and transferring-out shutters 40w are provided. The first shutter 40a forms an opening that allows entrance and exit of the first self-cleaning unit 25 and the first arm 21b supporting the first pen sponge 21a. The first shutter 40a is provided at a position and in a size such that the first arm 21b swinging with the connecting portion with the first moving unit 21c as a center is pulled out to the outside of the chamber 40. The second shutter 40b forms an opening that allows entrance and exit of the second self-cleaning unit 26 and the second arm 22b supporting the second pen sponge 22a. In the present embodiment, the second shutter 40b is provided on a surface opposed to the first shutter 40a in a plan view in such a manner that the swinging second arm 22b can be pulled out. Two transferring-in and transferring-out shutters 40w are provided, including a transferring-in and transferring-out shutter formed with an opening that allows entrance and exit of the substrate W held by the robot hand 52 (see FIG. 4) and a transferring-in and transferring-out shutter formed with an opening that allows entrance and exit of the substrate W held by the robot hand 53 (see FIG. 4). In the present embodiment, the two transferring-in and transferring-out shutters 40w are respectively provided in the two surfaces which are orthogonal to the surfaces of the chamber 40 in which the first shutter 40a and the second shutter 40b are provided, looked in a plan view.

The controller 250 is configured so as to be able to control the operation of the chuck 20 to thereby control the holding and releasing of the substrate W by the chuck 20 and the rotation of the substrate W within the horizontal plane. Additionally, the controller 250 is configured so as to be able to control the rotation of the first pen sponge 21a and the second pen sponge 22a and the movement of the first moving unit 21c and the second moving unit 22c. Additionally, the controller 250 is configured so as to be able to control the operation and stoppage of the first self-cleaning unit 25 and the second self-cleaning unit 26. Additionally, the controller 250 is configured so as to be able to control the presence or absence of supply of the chemical liquid or pure water from the first front surface chemical nozzle 145, the first front surface rinse nozzle 146, the second front surface chemical nozzle 245, and the second front surface rinse nozzle 246. Additionally, the controller 250 is configured so as to be able to control the opening and closing of the two transferring-in and transferring-out shutters 40w.

The operation of the cleaning device 2 configured as described above follows the operation of the cleaning device 1A (see FIGS. 1A and 1B). Hereinafter, the outline of the operation of the cleaning device 2 will be described. In the process of transferring the substrate W into the chamber 40, the first pen sponge 21a at the position of the first self-cleaning unit 25 moves to above the center of the substrate W held by the chuck 20. When the substrate W held by the chuck 20 rotates and the rotating speed thereof reaches a predetermined rotating speed, the first pen sponge 21a moves down and comes into contact with the front surface WA of the substrate W. When the first pen sponge 21a has come into contact with front surface WA, the first pen sponge moves from the rotating center of the substrate W to the peripheral edge portion thereof, thereby roughly cleaning the front surface WA. During the rough cleaning of the front surface WA, if necessary, a chemical liquid is supplied from the first front surface chemical nozzle 145 to the front surface WA, and/or pure water is supplied from the first front surface rinse nozzle 146 to the front surface WA. While the first pen sponge 21a roughly cleans the front surface WA, the second pen sponge 22a is self-cleaned at the position of the second self-cleaning unit 26.

When the rough cleaning of the front surface WA is completed, the first pen sponge 21a moves to the position of the first self-cleaning unit 25, and the second pen sponge 22a at the position of the second self-cleaning unit 26 moves to above the center of the substrate W held by the chuck 20 so as to replace the first pen sponge 21a. Next, the second pen sponge 22a, similar to the first pen sponge 21a, moves down, comes into contact with the front surface WA, and moves from the rotating center of the substrate W to the peripheral edge portion thereof. Incidentally, the movement direction of the second pen sponge 22a is opposite to that of the first pen sponge 21a. Finish cleaning of the front surface WA is performed by the movement of the second pen sponge 22a in contact with the front surface WA. During the finish cleaning of the front surface WA, if necessary, the chemical liquid is supplied from the second front surface chemical nozzle 245 to the front surface WA, and/or pure water is supplied from the second front surface rinse nozzle 246 to the front surface WA. While the second pen sponge 22a is finish-cleaning the front surface WA, the first pen sponge 21a is self-cleaned at the position of the first self-cleaning unit 25. When the finish cleaning of the front surface WA is completed, the second pen sponge 22a moves to the position of the second self-cleaning unit 26, and the substrate W is transferred out to the outside of the chamber 40.

Referring back to FIG. 4, the substrate cleaning apparatus 104 will be described. Incidentally, in the following description, FIGS. 1A and 1B will be appropriately referred to when the configuration of the cleaning device 1A is mentioned, and FIGS. 5A and 5B will be appropriately referred to when the configuration of the cleaning device 2 is mentioned. Although detailed description of the drying device 3 among the devices included in the substrate cleaning apparatus 104 is omitted, a drying device that grips the substrate W cleaned by the cleaning device 2 with a spin chuck to rotate the substrate at high speed, or a drying device that moves a drying gas stream from the center of the substrate W to an outer edge thereof while rotating the substrate W having a front surface covered with a rinsing liquid is used.

In the substrate cleaning apparatus 104, the cleaning device 1AS is arranged below the cleaning device 1AF, the cleaning device 2S is arranged below the cleaning device 2F, and, the drying device 3S is arranged below the drying device 3F. The cleaning device 1AF, the cleaning device 2F, and the drying device 3F are linearly arranged in this order within the same plane. The cleaning device 1AS, the cleaning device 2S, and the drying device 3S are linearly arranged in this order within the same plane. In the present embodiment, in principle, the substrate W, which has first been cleaned by the cleaning device 1AF, is next cleaned by the cleaning device 2F and is finally dried by the drying device 3F. Thus, the cleaning device 1AF, the cleaning device 2F, and the drying device 3F are arranged on a first cleaning line LF. Meanwhile, in principle, the substrate W, which has first been cleaned by the cleaning device 1AS, is next cleaned by the cleaning device 2S and is finally dried by the drying device 3S. Thus, the cleaning device 1AS, the cleaning device 2S, and the drying device 3S are arranged on a second cleaning line LS. Here, in principle, each of the cleaning lines is the transfer path of the substrate W when the processing (cleaning, drying, or the like) of one substrate W is performed by a plurality of devices, and do not exclude the substrate W from shifting to the other cleaning line on the way.

The first robot hand 52 is disposed in a space between the two cleaning devices 1AF and 1AS that are vertically arranged, and the two cleaning devices 2F and 2S that are vertically arranged. The first robot hand 52 is configured so as to be able to change its orientation and move up and down through a moving mechanism (not shown), and perform access to the inside of each of the cleaning devices 1AF, 1AS, 2F, and 2S. The second robot hand 53 is disposed in a space between the two cleaning devices 2F and 2S that are vertically arranged, and the two drying devices 3F and 3S that are vertically arranged. The second robot hand 53 is configured so as to be able to change its orientation and move up and down through a moving mechanism (not shown), and perform access to the inside of each of the cleaning devices 2F and 2S and the inside of each of the drying devices 3F and 3S.

The first robot hand 52 has an arm that is longer than the diameter of the substrate W (typically, slightly longer than the diameter of the substrate W) in a longitudinal direction and is smaller than the diameter of the substrate W in a width direction. The arm of the first robot hand 52 has a tip formed in a forked shape, and an upper portion thereof is provided with a gripping portion (not shown) that can sandwich and grip the outer edge of the substrate W. The second robot hand 53 has the same configuration to the first robot hand 52.

The substrate cleaning apparatus 104 configured as described above normally performs the cleaning and drying processing of the substrate W in the second cleaning line LS (the cleaning device 1AS, the cleaning device 2S, and the drying device 3S), in parallel to performing the cleaning and drying processing of the substrate W in the first cleaning line LF (the cleaning device 1AF, the cleaning device 2F, and the drying device 3F). In addition, the same processing of the substrate W is performed in the first cleaning line and the second cleaning line, respectively, and the contents of the processing are the rough cleaning performed by the first roll sponge 11a, the finish cleaning performed by the second roll sponge 12a, the rough cleaning performed by the first pen sponge 21a, and the finish cleaning performed by the second pen sponge 22a and drying.

In the substrate cleaning apparatus 104, with respect to each of the cleaning devices 1A and 2, one module is provided with two cleaning members. Thus, when the substrate cleaning apparatus 104 performs two steps of cleaning including rough cleaning and finish cleaning, one cleaning line does not interfere with the other cleaning line. In a prior-art apparatus in which one module is provided with one cleaning member, a portion of the other cleaning line is used in order to perform two steps of cleaning, and processing capacity degrades. In the substrate cleaning apparatus 104, the number of substrates W which can be cleaned and dried by one apparatus can be doubled without enlarging the apparatus, and throughput can be improved.

In the above description of the substrate cleaning apparatus 104, with respect to both of the cleaning device 1A and the cleaning device 2, one module is provided with two cleaning members. Therefore, one of the cleaning device 1A and the cleaning device 2 corresponds to a substrate cleaning device, and the other corresponds to an additional substrate cleaning device that is one form of an additional substrate processing section. In addition, at least one module may be provided with two cleaning members according to a cleaning demand for the substrates W. For example, the cleaning device 1A may include one roll sponge, and the cleaning device 2 may include two pen sponges 21a and 22a. In this case, the cleaning device 2 corresponds to a (first or second) substrate cleaning device, and the cleaning device 1A corresponds to a (first or second) additional substrate cleaning device. That is, in the additional substrate cleaning device, the number of cleaning members to be included in one module does not matter. Incidentally, the substrate cleaning apparatus 104 may include a drying device as the additional substrate processing section, without including the additional substrate cleaning device.

In the above description of the cleaning device 2, the cleaning performances of the first pen sponge 21a and the second pen sponge 22a are different from each other, and the operation of the cleaning device 2 is based on the operation of the cleaning device 1A. However, the first pen sponge 21a and the second pen sponge 22a may be configured to have equal cleaning performance, and the operation of the cleaning device 2 may be made to be based on the operation of the cleaning device 1 (the first pen sponge 21a cleans a substrate W and the second pen sponge 22a cleans another substrate W). Additionally, irrespective of whether the operation of the cleaning device 2 is based on the operation of the cleaning device 1A or is based on the operation of the cleaning device 1, the cleaning device 2 may be configured not to be a constituent element of the substrate cleaning apparatus 104 but to be as a substrate cleaning device that operates independently.

Figure 6A:
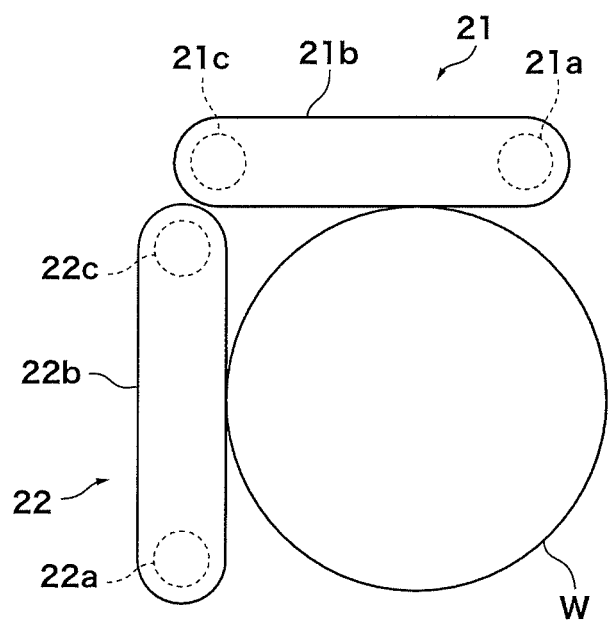
FIG. 6A is a plan view illustrating a first modification example of the arrangement of arms of the substrate cleaning device illustrated in FIG. 5A.
Figure 6B:
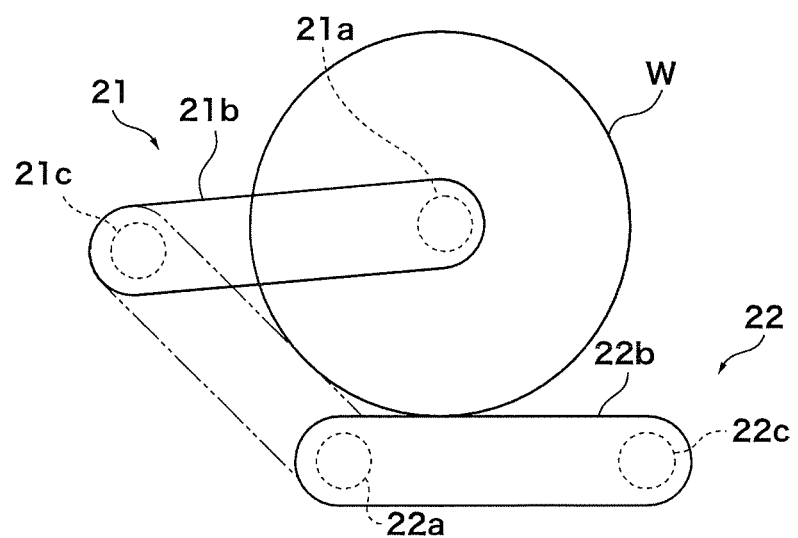
FIG. 6B is a plan view illustrating a second modification example of the arrangement of the arms of the substrate cleaning device illustrated in FIG. 5A.

In the above description of the cleaning device 2, the first cleaning unit 21 and the second cleaning unit 22 are arranged such that, in a plan view, the first moving unit 21c and the second moving unit 22c are symmetrical to each other with the center of the substrate W held by the chuck 20 as a center of symmetry and such that the first arm 21b and the second arm 22b at self-cleaning positions are parallel to each other. However, as illustrated in FIG. 6A, the first cleaning unit 21 and the second cleaning unit 22 may be arranged such that the first moving unit 21c and the second moving unit 22c are adjacent to each other and the first arm 21b and the second arm 22b at the self-cleaning positions are orthogonal to each other. In this case, since the rotation centers of the first arm 21b and the second arm 22b are different from each other, the tracks of the first pen sponge 21a and the track of the second pen sponge 22a are not the same. Otherwise, as illustrated in FIG. 6B, the first cleaning unit 21 and the second cleaning unit 22 may be disposed so that the position of the first pen sponge 21a when the first cleaning unit 21 has been withdrawn and the position of the second pen sponge 22a when the second cleaning unit 22 has been withdrawn are the same. In this case, one self-cleaning unit is easily shared by the first pen sponge 21a and the second pen sponge 22a.

Typically, the substrate cleaning apparatus 104 (or the cleaning devices 1, 1A, and 2 as independent substrate cleaning devices) described above is mounted on a substrate processing apparatus together with a chemical mechanical polishing (CMP) apparatus or a copper plating apparatus.

Figure 7:
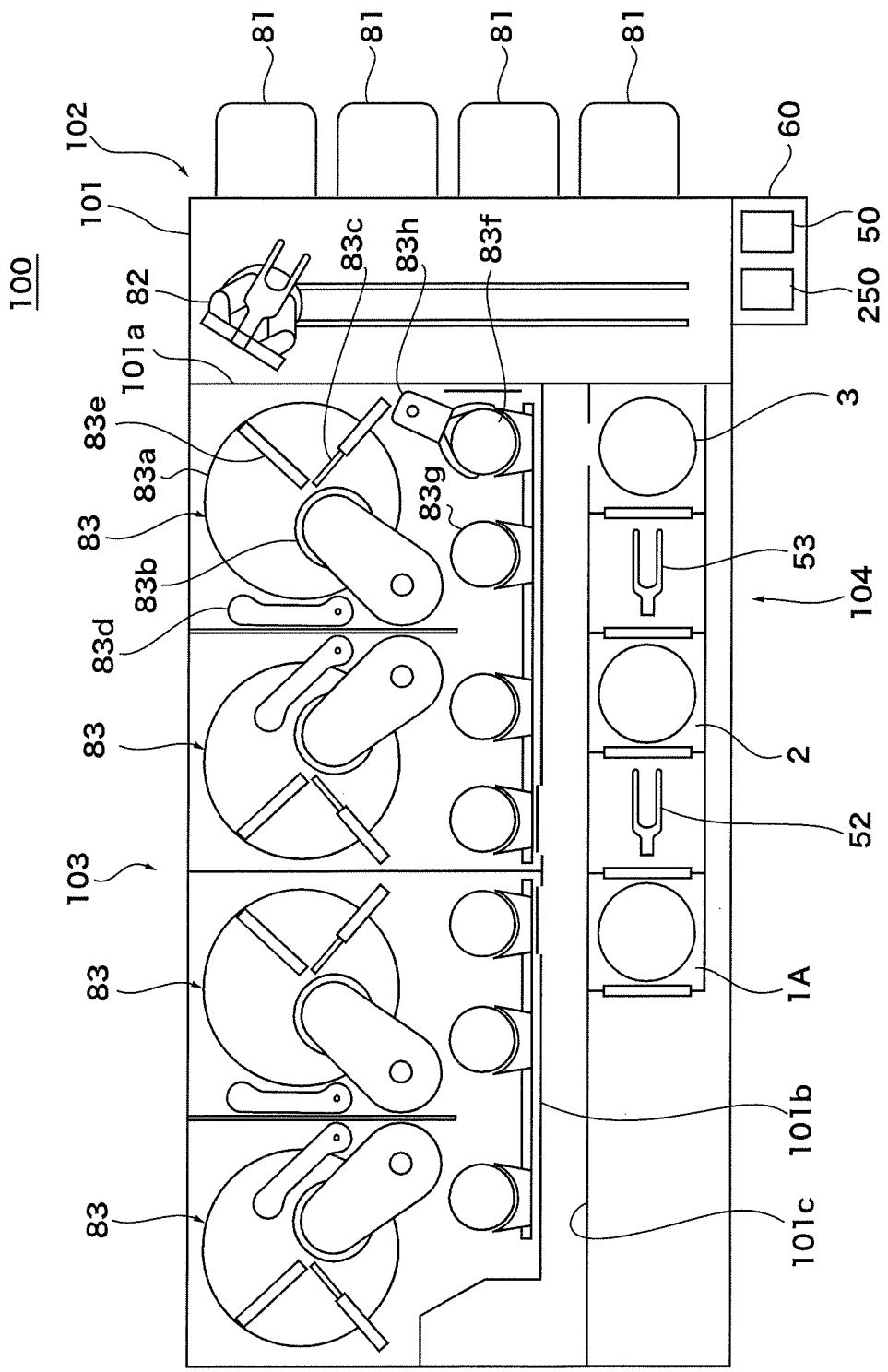
FIG. 7 is a plan view illustrating an overall configuration of a substrate processing apparatus on which the substrate cleaning apparatus related to the second embodiment of the present invention is mounted.

FIG. 7 is a plan view illustrating an overall configuration of a substrate processing apparatus 100 on which the substrate cleaning apparatus 104 is mounted. In the following description, FIG. 4 or FIGS. 5A and 5B will be appropriately referred to when the configuration of the substrate cleaning apparatus 104 is mentioned. The substrate processing apparatus 100 includes a substantially rectangular housing 101, and the inside of the housing 101 is demarcated by a plurality of partition walls 101a, 101b, and 101c, and is provided with a loading/unloading section 102, a polishing section 103 that polishes a substrate, and the above-described substrate cleaning apparatus 104 that cleans the substrate after the polishing. Additionally, the substrate processing apparatus 100 includes a controller 60 that controls the operation of the respective sections and apparatuses.

The loading/unloading section 102 has a plurality of cassettes 81 that stock a substrate, and a transfer robot 82 that transfers a substrate from each cassette 81 to the polishing section 103 or from the substrate cleaning apparatus 104 to each cassette 81. The transfer robot 82 includes two upper and lower hands, and is configured, for example, so that the upper hand can be used when returning a substrate to each cassette 81, the lower hand can be used when transferring a substrate before polishing, and the upper and lower hands can be used properly and separately.

The polishing section 103 has four polishing devices 83 having substantially the same configuration. Each polishing device 83 has a polishing table 83a having a polishing surface, a top ring 83b that can hold a substrate and press the substrate on the polishing table 83a, a polishing liquid supply nozzle 83c for supplying a polishing liquid such a slurry or a dressing liquid (for example, water), to the polishing table 83a, a dresser 83d for performing the dressing of the polishing table 83a, and an atomizer 83e that atomizes a mixed fluid of a liquid (for example, pure water) and a gas (for example, nitrogen) and jets the mixed liquid from one or a plurality of nozzles to the polishing surface. Additionally, each polishing device 83 has a lifter 83f that can be vertically lifted and lowered, and a pusher 83g that can be vertically lifted and lowered. The polishing device 83 adjacent to the transfer robot 82 has a reversal machine 83h that can receive a substrate from the transfer robot 82 and reverse it.

Each polishing device 83 is configured so as to be able to bring a substrate held by the top ring 83b into contact with the polishing table 83a and rotate the polishing table 83a and the top ring 83b at a respective predetermined rotating speed while supplying a polishing liquid from the polishing liquid supply nozzle 83c to the polishing table 83a, thereby polishing the front surface of the substrate. Additionally, each polishing device 83 is configured so as to be able to place a polished substrate on a lifter 83f, dress the surface of the polishing table 83a with the dresser 83d, and transfer the substrate placed on the lifter 83f to the robot hand 52 of the substrate cleaning apparatus 104 via a pusher 83g.

The substrate processing apparatus 100 configured as described above performs the following operation. Any one of substrates installed in the respective cassettes 81 is taken out by the transfer robot 82, and is transferred to the reversal machine 83h of the polishing section 103. The substrate is reversed by the reversal machine 83h and then transferred to the lifter 83f belonging to any one of the polishing devices 83, the substrate is pushed up by the lifter 83f after the top ring 83b is moved to above the lifter 83f, and the substrate is attached to the top ring 83b by suction. Thereafter, the substrate is brought into contact with the polishing table 83a, the supply of the polishing liquid is started from the polishing liquid supply nozzle 83c to the polishing table 83a and simultaneously the polishing table 83a and the top ring 83b are rotated at a respective predetermined rotating speed, and the front surface of the substrate is polished. When the front surface of the substrate is polished by a predetermined amount, pure water is supplied from a pure water supply nozzle (not shown) to perform the polishing of the substrate, instead of the supply of the polishing liquid from the polishing liquid supply nozzle 83c. When the polishing of the substrate has been performed for a predetermined period of time while supplying the pure water, the top ring 83b is lifted, the substrate is separated from the polishing table 83a, and the substrate is placed on the lifter 83f. At this time, a polishing cloth attached to the polishing table 83a is polished by the dresser 83d, and the polishing cloth is conditioned. When the substrate is placed on the lifter 83f, the lifter 83f is horizontally moved to the position of the pusher 83g and the substrate W is lifted by the pusher 83g, and then, the robot hand 52 of the substrate cleaning apparatus 104 receives the substrate.

When the robot hand 52 receives the substrate W, the aforementioned cleaning of the substrate W is performed in the substrate cleaning apparatus 104. The substrate W that has been cleaned and dried by the substrate cleaning apparatus 104 is taken out from the substrate cleaning apparatus 104 by the transfer robot 82, and is accommodated in the cassette 81 that stocks the substrate W after the cleaning. As described above, the substrate processing apparatus 100 including the substrate cleaning apparatus 104 can increase the number of processed substrates W, and can improve throughput.

In the above description, the substrate cleaning apparatus 104 is mounted on the substrate processing apparatus 100. However, one or a plurality of cleaning devices 1, 1A, and 2, may be arbitrarily selected and individually mounted instead of the substrate cleaning apparatus 104.

In the above description, in the cleaning device 1, the two cleaning members (roll sponges 11a and 12a) may be provided with the self-cleaning units 15 and 16 respectively as a pre-cleaning unit. However, one self-cleaning unit may be shared by the two cleaning members. Particularly when the two cleaning members are not distinguished from each other for rough cleaning and finish cleaning, the sharing is easy. This also applies to the cleaning devices 1A and 2.

In the above description, the first surface to be cleaned by the first cleaning unit 11 and the second cleaning unit 12 is the front surface WA of the substrate W. However, the first surface to be cleaned by the first cleaning unit 11 and the second cleaning unit 12 may be the rear surface WB, and the second surface may be the front surface WA.

In the above description, each first cleaning unit 11 or 21 and the second cleaning unit 12 or 22 are provided above the substrate W held by the substrate holding unit (the roller 10 or the chuck 20), but the first and second cleaning units may be provided below the substrate W held by the substrate holding unit.

As described hitherto, when a substrate is rinsed with a rinsing liquid, such as pure water, after the substrate is cleaned with a chemical when the substrate is cleaned using a roll sponge or a pen sponge, the rinsing liquid permeates into the sponge, and the rinsing liquid is held in the sponge. If the next substrate is cleaned in this state, there is a concern that the chemical supplied to the top surface of the substrate may be diluted with the rinsing liquid held by the sponge and cleaning performance may degrade. Thus, in order to prevent such dilution of the chemical, the following measures may be taken.

Figure 8:
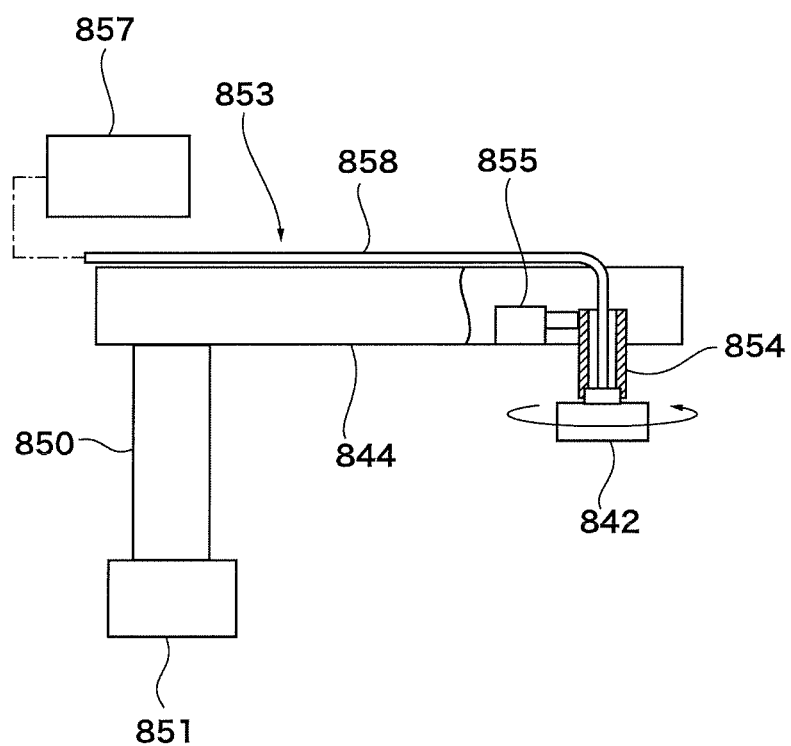
FIG. 8 is a schematic view illustrating a portion of the substrate cleaning device including a chemical supply mechanism.

FIG. 8 is a schematic view illustrating a portion of a substrate cleaning device including a chemical supply mechanism 853 that supplies chemical in advance to a pen sponge 842 before cleaning of a substrate. As illustrated in FIG. 8, the pen sponge 842 is fixed to a lower end of a supporting shaft 854. Moreover, the pen sponge 842 is coupled to a cleaning tool rotating mechanism 855 via the supporting shaft 854, and the pen sponge 842 is adapted to be rotated by the cleaning tool rotating mechanism 855 around a central axis thereof extending in a vertical direction. The supporting shaft 854 and the cleaning tool rotating mechanism 855 are fixed to an arm 844. Although illustration is omitted, a substrate to be cleaned is held by a substrate holding part so that the front surface thereof is parallel to a direction in which the arm 844 extends. Additionally, the substrate cleaning device illustrated in FIG. 8 is provided with a chemical supply nozzle (not shown) that supplies a chemical liquid to the top surface of a substrate, and a rinsing liquid supply nozzle (not shown) that supplies a rinsing liquid to the top surface of the substrate. A pivot shaft 850 is coupled to the other end of the arm 844. A cleaning tool moving mechanism 851 that turns the arm 844 is coupled to the pivot shaft 850. The cleaning tool moving mechanism 851 is adapted to rotate the pivot shaft 850 by a predetermined angle to thereby pivot the arm 844 within a plane parallel to the substrate. The pen sponge 842 supported by the arm 844 is moved in a radial direction of the substrate by the turning of the arm 844. Moreover, the cleaning tool moving mechanism 851 is configured so as to be capable of vertically moving the pivot shaft 850, and thereby, the pen sponge 842 can be pressed on the top surface of a substrate with a predetermined pressure.

The chemical supply mechanism 853 includes a chemical supply source 857, and a supply pipe 858 that extends from the chemical supply source 857 to the pen sponge 842. The supporting shaft 854 is constituted by a hollow shaft, and a portion of the supply pipe 858 extends through an internal space of the supporting shaft 854. A tip of the supply pipe 858 is arranged immediately above the pen sponge 842, and a chemical liquid is supplied from above the pen sponge 842 to the pen sponge 842. The pen sponge 842 is made of a porous medium, such as foamed polyurethane or PVA (polyvinyl alcohol), and enables the chemical to pass therethrough.

The chemical liquid is directly supplied from the chemical supply source 857 through the supply pipe 858 to the pen sponge 842 before the cleaning of the next substrate begins. The chemical liquid spreads over the entire pen sponge 842, and eliminates a rinsing liquid used for the cleaning of the previous substrate from the pen sponge 842. Once the rinsing liquid is removed from the pen sponge 842, the chemical liquid supplied to the next substrate is not diluted by the rinsing liquid. Accordingly, the concentration of the chemical liquid is stabilized, and the degradation of the cleaning performance is prevented.

Figure 9A:
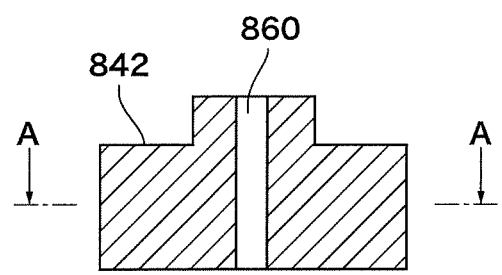
FIG. 9A is a cross-sectional view illustrating an example of a pen sponge.
Figure 9B:
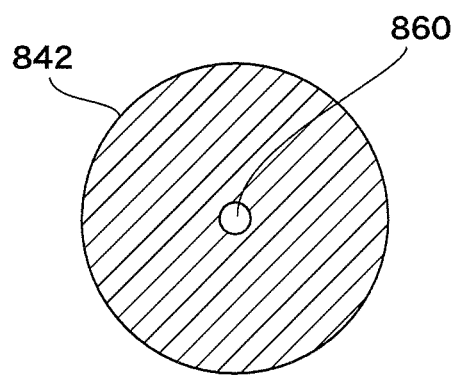
FIG. 9B is a cross-sectional view taken along line A-A of FIG. 9A.

FIG. 9A is a cross-sectional view illustrating an example of the pen sponge 842, and FIG. 9B is a cross-sectional view taken along line A-A of FIG. 9A. The pen sponge 842 has a chemical flow passage 860 therein. The chemical flow passage 860 extends in the vertical direction on a central axis of the pen sponge 842, and passes through the pen sponge 842. The tip of the supply pipe 858 is located immediately above a top opening of the chemical flow passage 860, and a chemical liquid is directly supplied to the chemical flow passage 860. That is, the chemical liquid is directly supplied to the inside of the pen sponge 842. The chemical liquid rapidly spreads over the entire pen sponge 842 while flowing through the chemical flow passage 860, and eliminates a rinsing liquid used for the cleaning of the previous substrate from the pen sponge 842.

Figure 10A:
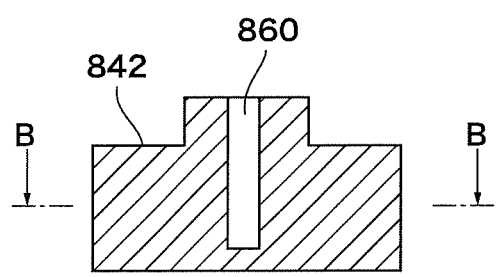
FIG. 10A is a cross-sectional view illustrating another example of the pen sponge.
Figure 10B:
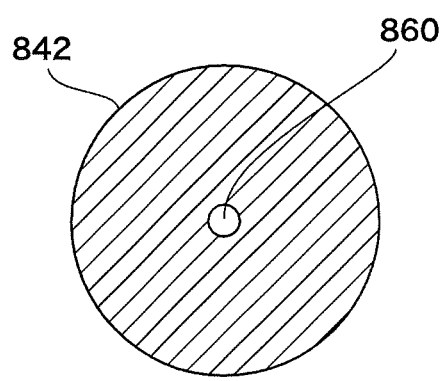
FIG. 10B is a cross-sectional view taken along line B-B of FIG. 10A.

FIG. 10A is a cross-sectional view illustrating another example of the pen sponge 842, and FIG. 10B is a cross-sectional view taken along line B-B of FIG. 10A. Although the chemical flow passage 860 of this example is the same as the chemical flow passage 860 illustrated in FIGS. 9A and 9B in the sense that this chemical flow passage extends along the central axis of the pen sponge 842, there is a difference in the sense that a lower end thereof is closed.

Figure 11A:
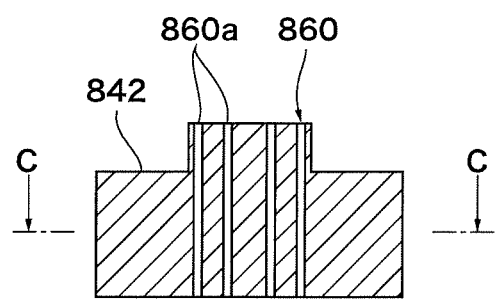
FIG. 11A is a cross-sectional view illustrating still another example of the pen sponge.
Figure 11B:
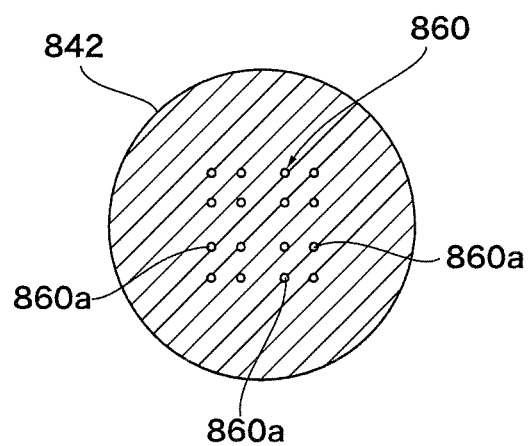
FIG. 11B is a cross-sectional view taken along line C-C of FIG. 11A.

FIG. 11A is a cross-sectional view illustrating still another example of the pen sponge 842, and FIG. 11B is a cross-sectional view taken along line C-C of FIG. 11A. In this example, the chemical flow passage 860 is constituted by a plurality of through-holes 860a extending parallel to the central axis of the pen sponge 842. The through-holes 860a are not formed along the central axis of the pen sponge 842, but are arranged around the central axis of the pen sponge 842.

Figure 12A:
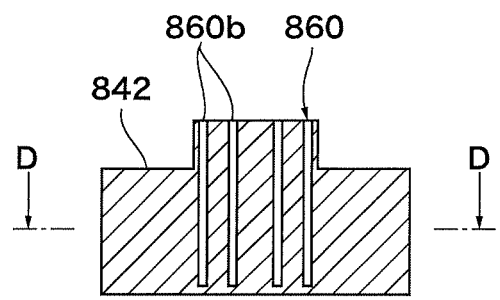
FIG. 12A is a cross-sectional view illustrating a still further example of the pen sponge.
Figure 12B:
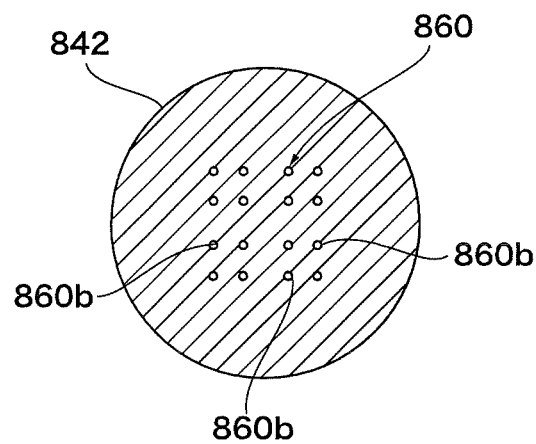
FIG. 12B is a cross-sectional view taken along line D-D of FIG. 12A.

FIG. 12A is a cross-sectional view illustrating a still further example of the pen sponge 842, and FIG. 12B is a cross-sectional view taken along line D-D of FIG. 12A. In this example, the chemical flow passage 860 is constituted by a plurality of vertical holes 860b that extend parallel to the central axis of the pen sponge 842, an upper end of each vertical hole 860b is open, and a lower end of each vertical hole is closed. The arrangement of the vertical holes 860b is the same as the arrangement of the through-holes 860a illustrated in FIGS. 11A and 11B.

Figure 13A:
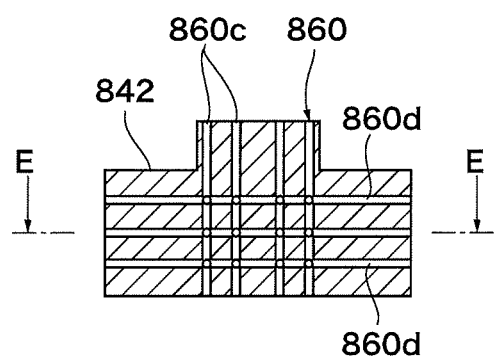
FIG. 13A is a cross-sectional view illustrating a still further example of the pen sponge.
Figure 13B:
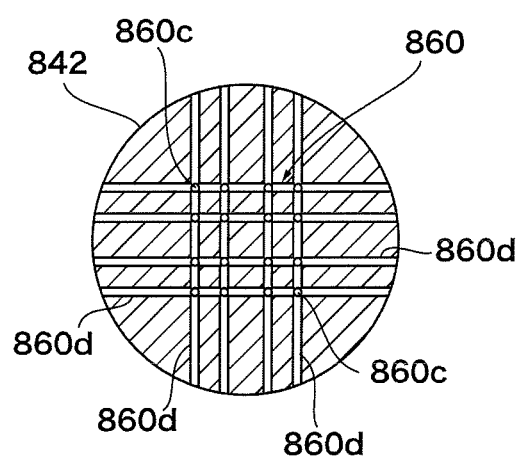
FIG. 13B is a cross-sectional view taken along line E-E of FIG. 13A.

FIG. 13A is a cross-sectional view illustrating a still further example of the pen sponge 842, and FIG. 13B is a cross-sectional view taken along line E-E of FIG. 13A. In this example, the chemical flow passage 860 is constituted by a plurality of first through-holes 860c that extend parallel to the central axis of the pen sponge 842, and a plurality of second through-holes 860d perpendicular to the first through-holes 860c. The second through-holes 860d open on an outer peripheral surface of the pen sponge 842. The second through-holes 860d communicate with the first through-holes 860c, respectively. The arrangement of the first through-holes 860c is the same as the arrangement of the through-holes 860a illustrated in FIGS. 11A and 11B.

Figure 14A:
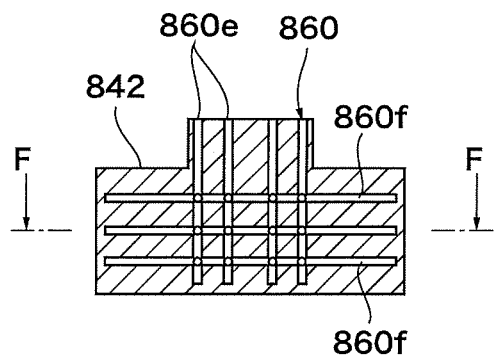
FIG. 14A is a cross-sectional view illustrating a still further example of the pen sponge.
Figure 14B:
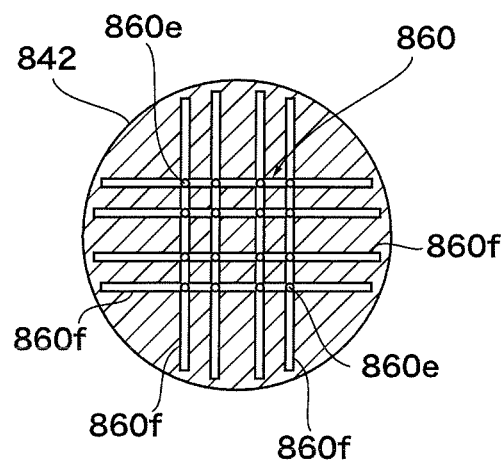
FIG. 14B is a cross-sectional view taken along line F-F of FIG. 14A.

FIG. 14A is a cross-sectional view illustrating a still further example of the pen sponge 842, and FIG. 14B is a cross-sectional view taken along line F-F of FIG. 14A. In this example, the chemical flow passage 860 is constituted by a plurality of vertical holes 860e that extend parallel to the central axis of the pen sponge 842, and a plurality of horizontal holes 860f perpendicular to the vertical holes 860e. An upper end of each vertical hole 860e is open, and a lower end thereof is closed. Both ends of each horizontal hole 860f are closed. The horizontal holes 860f communicate with the vertical holes 860e, respectively. The arrangement of the vertical holes 860e is the same as the arrangement of the through-holes 860a illustrated in FIGS. 11A and 11B.

The chemical flow passages 860 described in FIGS. 9A to 14B can rapidly spread a chemical liquid over the entire pen sponge 842, and can rapidly eliminate a rinsing liquid that is present inside the pen sponge 842.

Next, a method for cleaning a substrate using the substrate cleaning device including the chemical supply mechanism 853 (see FIG. 8) will be described. When the pen sponge 842 is at a withdrawal position radially outside a substrate, the above-described chemical supply mechanism 853 supplies a chemical liquid to the pen sponge 842 to remove a rinsing liquid from the pen sponge 842, during a predetermined period of time. It is preferable to supply the chemical liquid to the pen sponge 842 while rotating the pen sponge 842. Next, the substrate is rotated around the central axis thereof, and the chemical liquid is supplied to the top surface of the substrate from the chemical supply nozzle. In this state, the pen sponge 842 is brought into contact with the front surface of the substrate while the pen sponge 842 is rotated around that central axis thereof.

Moreover, the front surface of the substrate is scrubbed and cleaned by reciprocating the pen sponge 842 in the radial direction of the substrate with the contact between the pen sponge 842 and the substrate maintained. Next, while the supply of the chemical liquid is stopped, the rinsing liquid is supplied to the front surface of the substrate and the front surface of the substrate is rinsed. After the rinsing of the substrate is completed, the rotation of the substrate and the pen sponge 842 is stopped, and the pen sponge 842 is moved to the withdrawal position outside the substrate.

Figure 15:
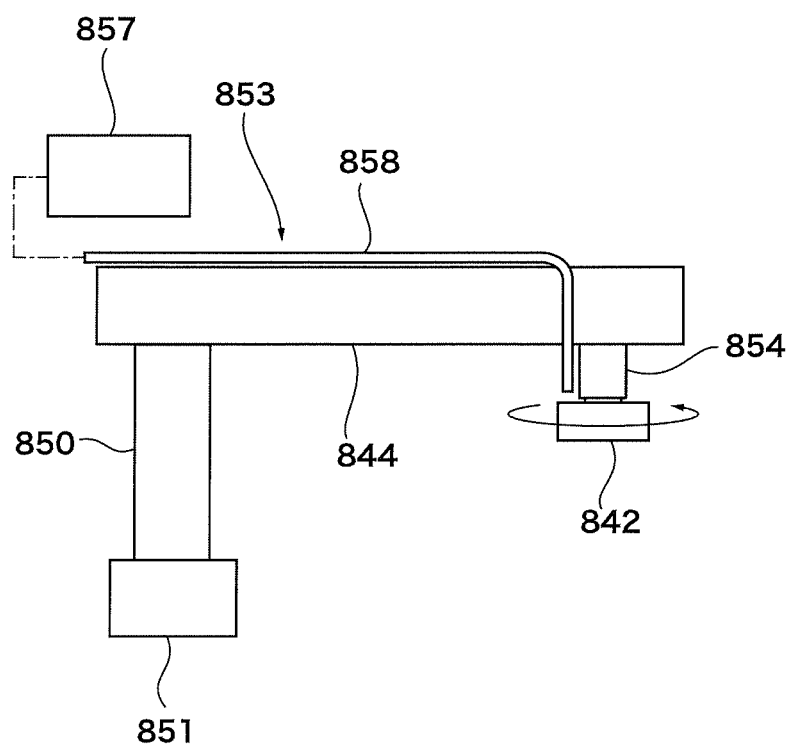
FIG. 15 is a view illustrating another embodiment of the substrate cleaning apparatus.

FIG. 15 is a view illustrating another embodiment of the substrate cleaning device. In this embodiment, the supply pipe 858 is arranged outside the supporting shaft 854. The tip of the supply pipe 858 is arranged immediately above the pen sponge 842, and chemical liquid is supplied to the top surface of the pen sponge 842.

Figure 16A:
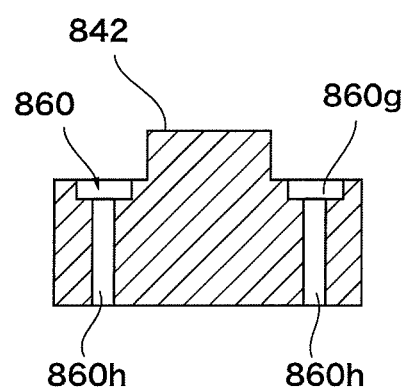
FIG. 16A is a cross-sectional view of the pen sponge illustrated in FIG. 15.
Figure 16B:
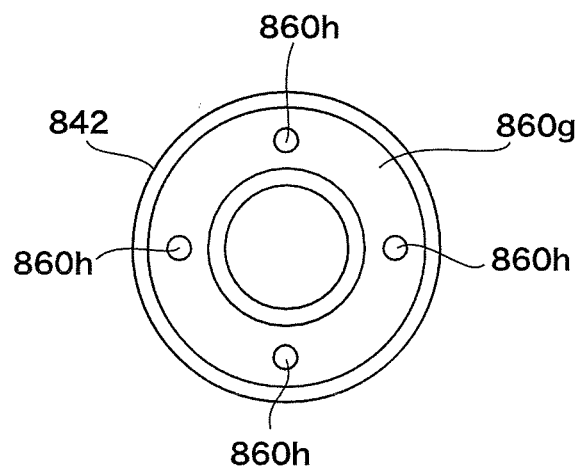
FIG. 16B is a top view of the pen sponge illustrated in FIG. 15.

FIG. 16A is a cross-sectional view of the pen sponge 842 illustrated in FIG. 15, and FIG. 16B is a top view of the pen sponge 842 illustrated in FIG. 15. The chemical flow passage 860 of the pen sponge 842 is constituted by an annular groove 860g formed in the top surface of the pen sponge 842, and a plurality of vertical holes 860h connected to the annular groove 860g. Although each vertical hole 860h illustrated in this drawing passes through the pen sponge 842, a lower end thereof may be closed. The tip of the supply pipe 858 is located immediately above the annular groove 860g, and a chemical liquid is supplied into the annular groove 860g. The chemical liquid spreads over the entire pen sponge 842 while flowing through the annular groove 860g and the plurality of vertical holes 860h, and removes a rinsing liquid from the pen sponge 842.

The configuration of the above-described chemical supply mechanism 853 that directly supplies a chemical liquid to the pen sponge 842 can be applied to the first cleaning unit 21 and/or the second cleaning unit 22 in the cleaning device 2 illustrated in FIGS. 5A and 5B. Additionally, the configuration of the chemical supply mechanism 853 that directly supplies chemical liquid to the pen sponge 842 can also be applied not only to the cleaning device having two cleaning members in one module but also the cleaning device in which one module is provided with one cleaning member.

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and similar referents in the context of describing the invention (especially in the context of the following claims) is to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventors for carrying out the invention. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

DESCRIPTION OF REFERENCE NUMERALS AND SYMBOLS 1, 1A cleaning device
2 cleaning device
10 roller
11 first cleaning unit
11a first roll sponge
12 second cleaning unit
12a second roll sponge
15 first self-cleaning unit
16 second self-cleaning unit
20 chuck
21 first cleaning unit
21a first pen sponge
22 second cleaning unit
22a second pen sponge
25 first self-cleaning unit
26 second self-cleaning unit
40 chamber
41 first pulling-out mechanism
42 second pulling-out mechanism
50 controller
83 polishing device
100 substrate processing apparatus
104 substrate cleaning apparatus
W substrate
WA front surface
WB rear surface

What is claimed is:

1. A substrate cleaning device comprising:
a first sponge cleaning tool configured to clean a substrate;
a second sponge cleaning tool configured to clean the substrate;
a first self-cleaning unit configured to clean the first sponge cleaning tool;
a second self-cleaning unit configured to clean the second sponge cleaning tool;
a chamber configured to accommodate the first and second sponge cleaning tools and the first and second self-cleaning units; and
a pulling-out mechanism capable of pulling out the first self-cleaning unit with the first sponge cleaning tool with respect to the chamber thereby performing a maintenance of the first sponge cleaning tool disposed outside the chamber while cleaning the substrate with the second sponge cleaning tool inside the chamber.

2. The substrate cleaning device according to claim 1, wherein each of the first and second sponge cleaning tools has a chemical flow passage therein, and the chemical flow passage is configured to have a chemical liquid flow therein.

3. The substrate cleaning device according to claim 1, further comprising:
a chemical supply mechanism configured to supply a chemical liquid directly to an inside of each of the first and second sponge cleaning tools.

4. The substrate cleaning device according to claim 1, further comprising:
a chemical supply mechanism configured to supply a chemical liquid directly to each of the first and second sponge cleaning tools,
wherein the chemical supply mechanism includes a supply pipe which supplies the chemical liquid to an exposed top surface of each of the first and second sponge cleaning tools.

5. The substrate cleaning device according to claim 1, further comprising:
a first arm configured to support the first sponge cleaning tool, the first arm being in the chamber; and
a second arm configured to support the second sponge cleaning tool, the second arm being in the chamber.

6. The substrate cleaning device according to claim 1, wherein the first self-cleaning unit is configured to include a first cleaning plate to which the first sponge cleaning tool is pressed and to include a first sponge cleaning nozzle which provides chemical liquid to the first sponge cleaning tool; and
wherein the second self-cleaning unit is configured to include a second cleaning plate to which the second sponge cleaning tool is pressed and to include a second sponge cleaning nozzle which provides chemical liquid to the second sponge cleaning tool.

7. The substrate cleaning device according to claim 1, further comprising:
a controller configured to control the first and second sponge cleaning tools and the first and second self-cleaning units so that a first substrate is cleaned by the first sponge cleaning tool, then a second substrate is cleaned by the second sponge cleaning tool, wherein one of the first and second sponge cleaning tools, which is not used for cleaning the respective first or second substrate, is cleaned by the first or second self-cleaning unit.

8. The substrate cleaning device according to claim 1, wherein the first cleaning sponge tool is a pencil-type pen sponge or a roll sponge; and
wherein the second cleaning sponge tool is a pencil-type pen sponge or a roll sponge.

9. The substrate cleaning device according to claim 6, wherein the first self-cleaning unit is configured to include a first pure-water nozzle which provides pure water to the first sponge cleaning tool; and
wherein the second self-cleaning unit is configured to include a second pure-water nozzle which provides pure water to the second sponge cleaning tool.

10. The substrate cleaning device according to claim 1, wherein the pulling-out mechanism is configured to include a first pulling-out mechanism which guides the first self-cleaning unit with the first sponge cleaning tool to the outside of the chamber and to include a second pulling-out mechanism which guides the second self-cleaning unit with the second sponge cleaning tool to the outside of the chamber.

11. A substrate cleaning apparatus comprising:
a plurality of the substrate cleaning devices according to claim 1;
wherein a first substrate cleaning device of the plurality of substrate cleaning devices is arranged on a first cleaning line and a second substrate cleaning device of the plurality of substrate cleaning devices is arranged on a second cleaning line separate from the first cleaning line;
the substrate cleaning apparatus further comprising:
a first drying device configured to dry a substrate which has been cleaned, the first drying device being arranged on the first cleaning line;
a second drying device configured to dry a substrate which has been cleaned, the second drying device being arranged on the second cleaning line;
a first robot hand configured to be able to perform access to the inside of each of the first and second substrate cleaning devices and the inside of each of the first and second drying devices; and
a second robot hand configured to be able to perform access to the inside of each of the first and second substrate cleaning devices and the inside of each of the first and second drying devices.

12. A substrate processing apparatus comprising:
the substrate cleaning apparatus according to claim 11; and
a substrate processing device configured to process a substrate before cleaning in the substrate cleaning apparatus.

13. A method for manufacturing a cleaned substrate, the method comprising the steps of:
providing the substrate cleaning device according to claim 1 with the substrate; and
cleaning the substrate in the substrate cleaning device.

* * * * *